(12) United States Patent
Jen et al.

(10) Patent No.: US 11,563,127 B2
(45) Date of Patent: Jan. 24, 2023

(54) SEMICONDUCTOR DEVICE

(71) Applicant: Taiwan Semiconductor Manufacturing Company, Ltd., Hsinchu (TW)

(72) Inventors: Chi-Chung Jen, Kaohsiung (TW); Ya-Chi Hung, Kaohsiung (TW); Yu-Chun Shen, Tainan (TW); Shun-Neng Wang, New Taipei (TW); Wen-Chih Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/143,820

(22) Filed: Jan. 7, 2021

(65) Prior Publication Data
US 2022/0216342 A1    Jul. 7, 2022

(51) Int. Cl.
*H01L 29/788* (2006.01)
*H01L 27/11521* (2017.01)
*H01L 29/66* (2006.01)
*H01L 21/28* (2006.01)
*H01L 21/321* (2006.01)
*H01L 29/423* (2006.01)

(52) U.S. Cl.
CPC ...... *H01L 29/7883* (2013.01); *H01L 21/3212* (2013.01); *H01L 27/11521* (2013.01); *H01L 29/40114* (2019.08); *H01L 29/42324* (2013.01); *H01L 29/66825* (2013.01)

(58) Field of Classification Search
None
See application file for complete search history.

(56) References Cited

U.S. PATENT DOCUMENTS

| 8,421,144 | B2* | 4/2013 | Kang | H01L 29/40114 |
| | | | | 438/257 |
| 2014/0377921 | A1* | 12/2014 | Ema | H01L 27/0922 |
| | | | | 438/258 |
| 2017/0170170 | A1* | 6/2017 | Fang | H01L 21/823456 |

\* cited by examiner

*Primary Examiner* — Xiaoming Liu
(74) *Attorney, Agent, or Firm* — Harrity & Harrity, LLP

(57) ABSTRACT

In some implementations, one or more semiconductor processing tools may form a triple-stacked polysilicon structure on a substrate of a semiconductor device. The one or more semiconductor processing tools may form one or more polysilicon-based devices on the substrate of the semiconductor device, wherein the triple-stacked polysilicon structure has a first height that is greater than one or more second heights of the one or more polysilicon-based devices. The one or more semiconductor processing tools may perform a chemical-mechanical polishing (CMP) operation on the semiconductor device, wherein performing the CMP operation comprises using the triple-stacked polysilicon structure as a stop layer for the CMP operation.

20 Claims, 21 Drawing Sheets

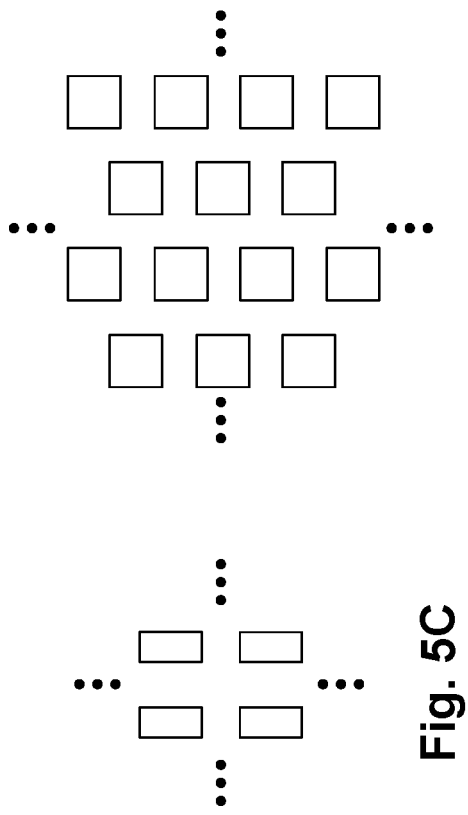
Fig. 5D
Fig. 5C
Fig. 5B
Fig. 5A
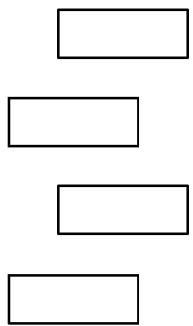
Fig. 5G
Fig. 5F
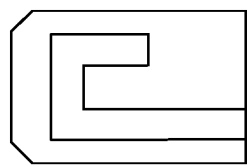
Fig. 5E

SEMICONDUCTOR DEVICE

BACKGROUND

A transistor is a common type of semiconductor device in electronic devices that is able to amplify and/or switch electrical signals. A transistor may be configured with three terminals to receive one or more applications of voltage. A voltage applied to a first terminal associated with a gate may control a current across a second terminal associated with a source voltage and a third terminal associated with a drain voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5G are diagrams of example triple-stacked polysilicon structures described herein.

DETAILED DESCRIPTION

Figure 1:
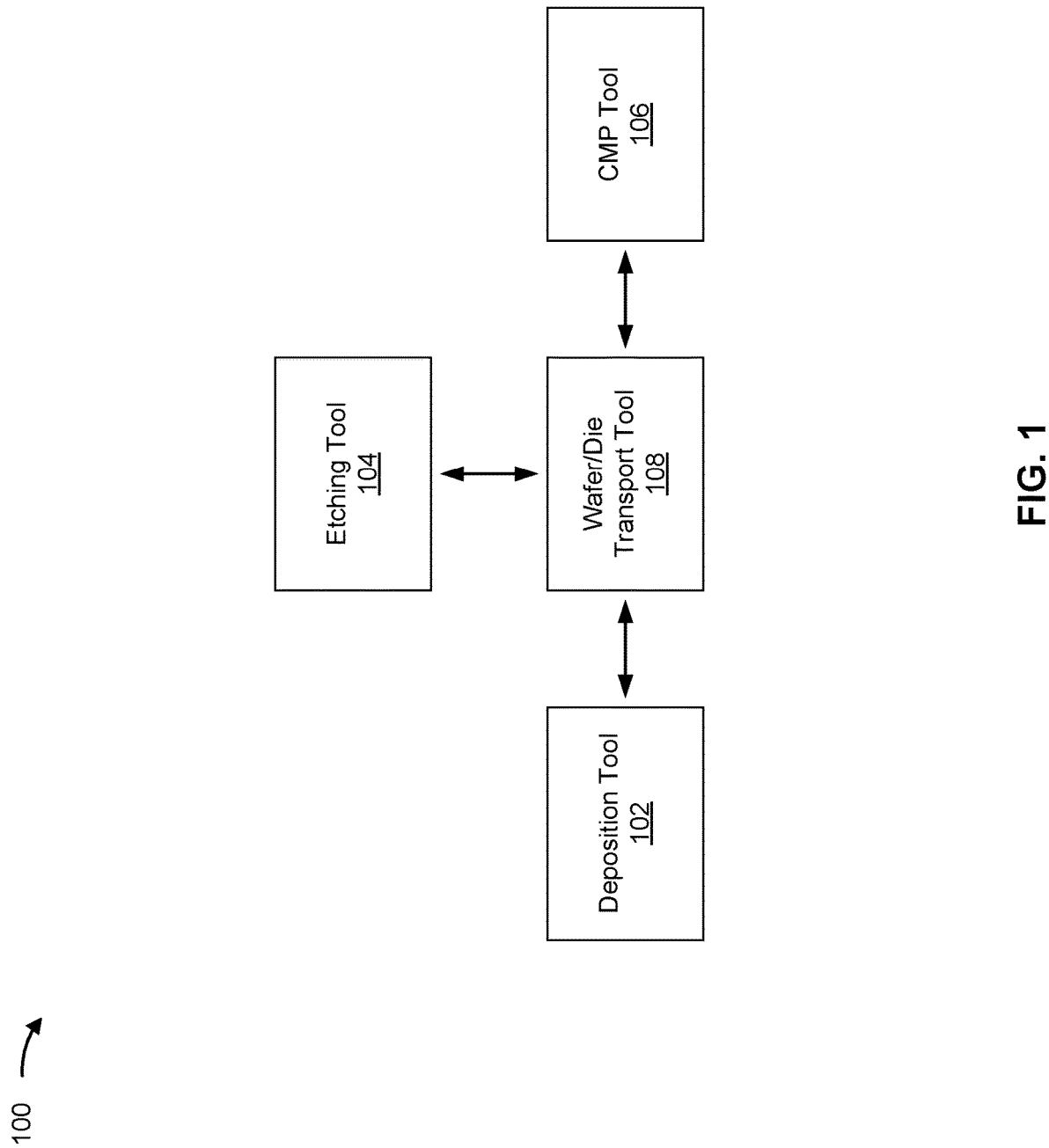
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a process of forming a semiconductor device (e.g., a transistor) may include depositing one or more polysilicon layers (e.g., a control gate, a floating gate, and/or a logic polysilicon, among other examples) on a substrate, depositing an inter-layer dielectric on the substrate and the one or more polysilicon layers, depositing one or more contacts within the inter-layer dielectric, and/or depositing electrodes on the inter-layer dielectric. Before depositing the electrodes on the inter-layer dielectric, one or more semiconductor tools may perform a chemical-mechanical polishing (CMP) operation to polish an upper surface of the inter-layer dielectric. The one or more semiconductor tools may be configured to perform the CMP operation for a configured amount of time (e.g., to remove a generally consistent amount of material from an upper surface of the semiconductor device). If the CMP operation removes too much of the inter-layer dielectric, one or more polysilicon-based devices of the semiconductor device may be exposed from within the inter-layer dielectric. Based on one or more of the polysilicon-based devices being exposed from within the inter-layer dielectric, an electrode deposited on the inter-layer dielectric may cause a short with the one or more polysilicon-based devices.

Some implementations described herein provide techniques and apparatuses for depositing a triple-stacked polysilicon structure, within a semiconductor device, that is configured as a stop layer for a CMP operation. In this way, the CMP operation may stop based on exposing a top polysilicon layer of the triple-stacked polysilicon structure, rather than operating for a configured amount of time. The stacked polysilicon is configured with a first height that is greater than one or more second heights of one or more polysilicon-based devices of the semiconductor device. Based on the triple-stacked polysilicon structure having a first height that is greater than the one or more second heights, the triple-stacked polysilicon structure may be used as a stop layer for a CMP operation. For example, one or more semiconductor processing tools may be configured to use the triple-stacked polysilicon structure as a stop layer when polishing an inter-layer dielectric of the semiconductor device (e.g., a dielectric material deposited on the semiconductor device including on the one or more polysilicon-based devices and on the triple-stacked polysilicon structure). In this way, a portion of the inter-layer dielectric may be disposed above the one or more polysilicon-based devices after the CMP operation. The portion of the inter-layer dielectric may provide a layer of insulation between the one or more polysilicon-based devices and an electrode on the inter-layer dielectric. This may reduce or prevent shorting between the one or more polysilicon-based devices and the electrode, which may reduce defects from the manufacturing process.

FIG. 1 is a diagram of an example environment 100 in which systems and/or methods described herein may be implemented. As shown in FIG. 1, environment 100 may include a plurality of semiconductor processing tools 102-106 and a wafer/die transport tool 108. The plurality of semiconductor processing tools 102-106 may include a deposition tool 102, an etching tool 104, a CMP tool 106, and/or other the like. The tools included in example environment 100 may be included in a semiconductor clean room, a semiconductor foundry, a semiconductor foundry, a semiconductor processing and/or manufacturing facility, and/or the like.

Deposition tool 102 is a semiconductor processing tool that is capable of depositing various types of materials onto a substrate. In some implementations, deposition tool 102 includes a spin coating tool that is capable of depositing a photoresist layer on a substrate such as a wafer. In some implementations, deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, deposition tool 102 includes a physical vapor deposition (PVD) tool, such as a sputtering tool or another type of PVD tool. In some implementations, the example environment 100 includes a plurality of types of deposition tools 102.

Etching tool 104 is a semiconductor processing tool that is capable of etching various types of materials of a substrate, wafer, or semiconductor device. For example, etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotopically or directionally etch the one or more portions), or another type of dry etching technique.

CMP tool 106 is a semiconductor processing tool that is capable of polishing or planarizing various layers of a wafer or semiconductor device. For example, a planarization tool may polish or planarize a layer or surface of deposited or plated material. The planarization tool may polish or planarize a surface of a semiconductor device with a combination of chemical and mechanical forces (e.g., chemical etching and free abrasive polishing). The planarization tool may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device generally flat or planar.

Wafer/die transport tool 108 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-106 and/or to and from other locations such as a wafer rack, a storage room, and/or the like. In some implementations, wafer/die transport tool 108 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2A:
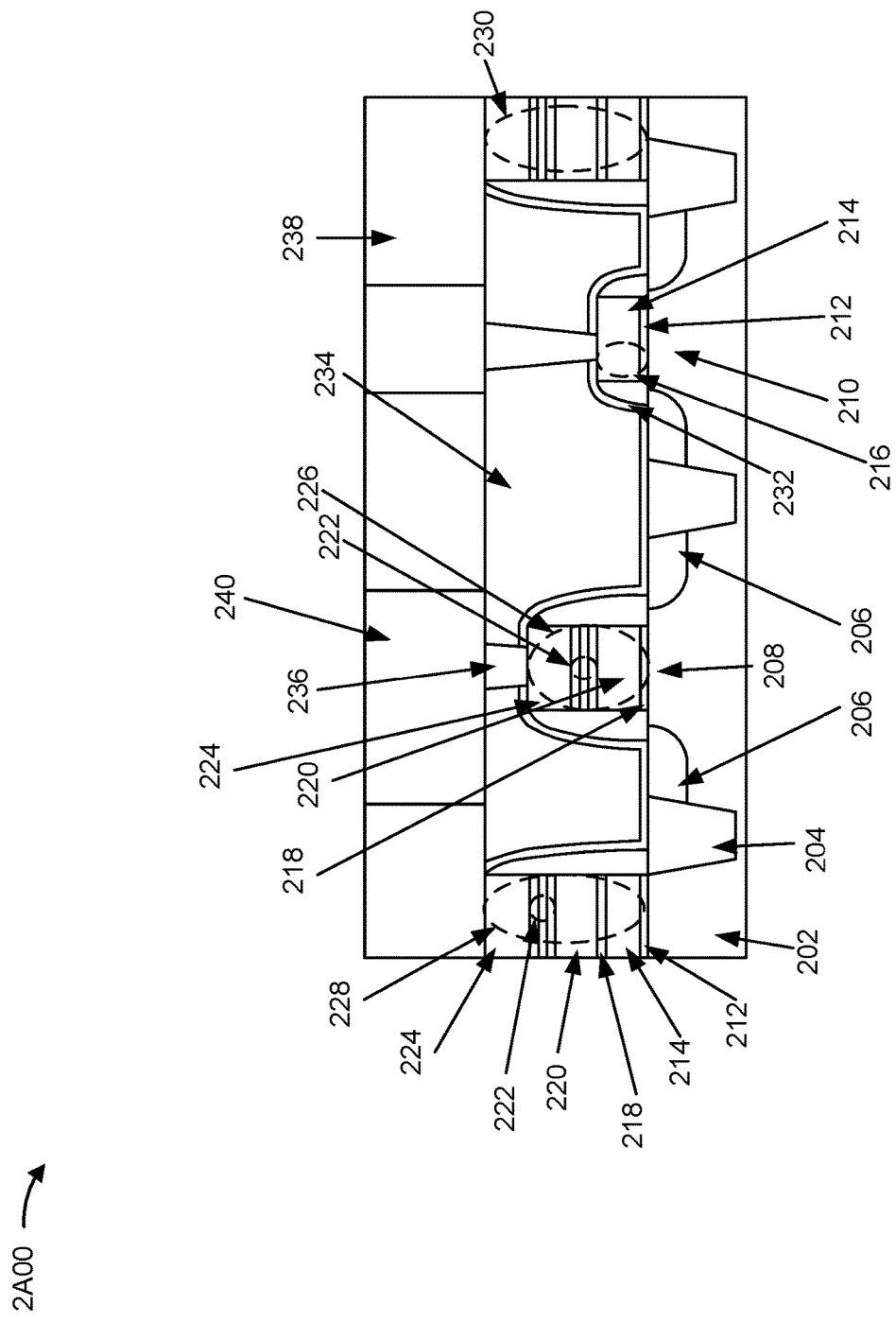
FIGS. 2A-2C are diagrams of examples of a semiconductor structure described herein.
Figure 2B:
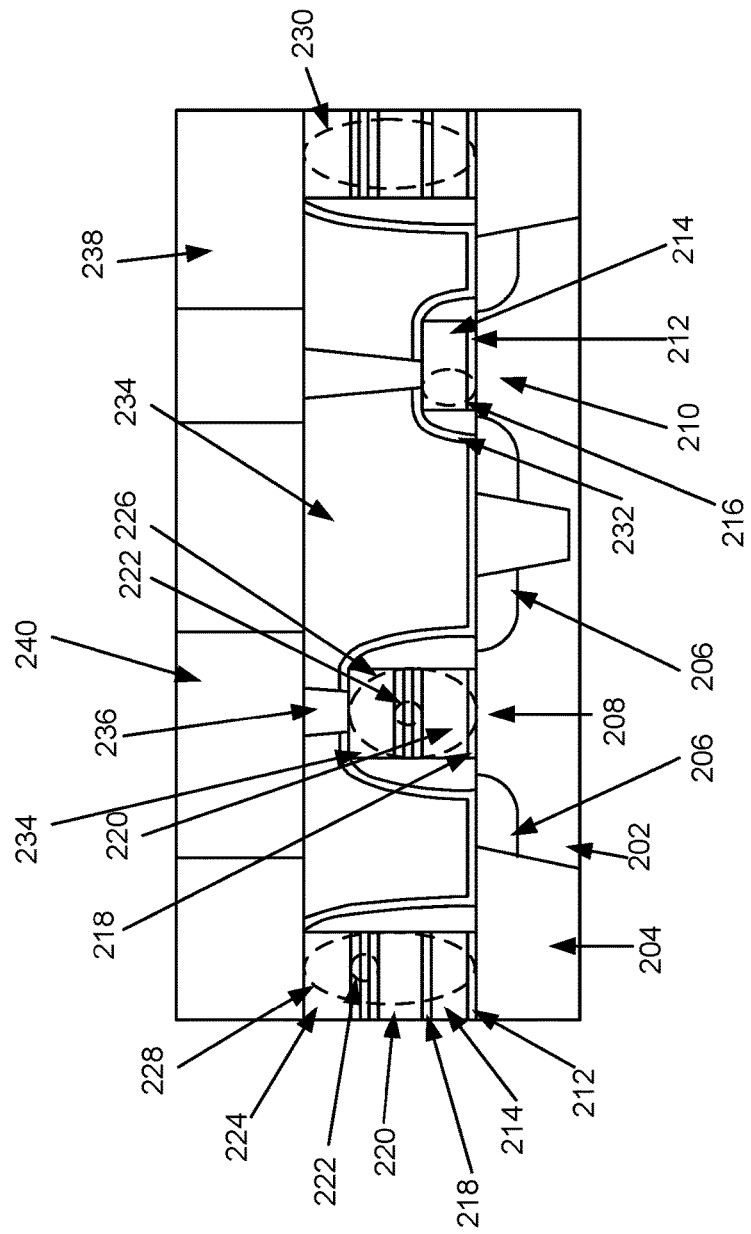
Figure 2C:
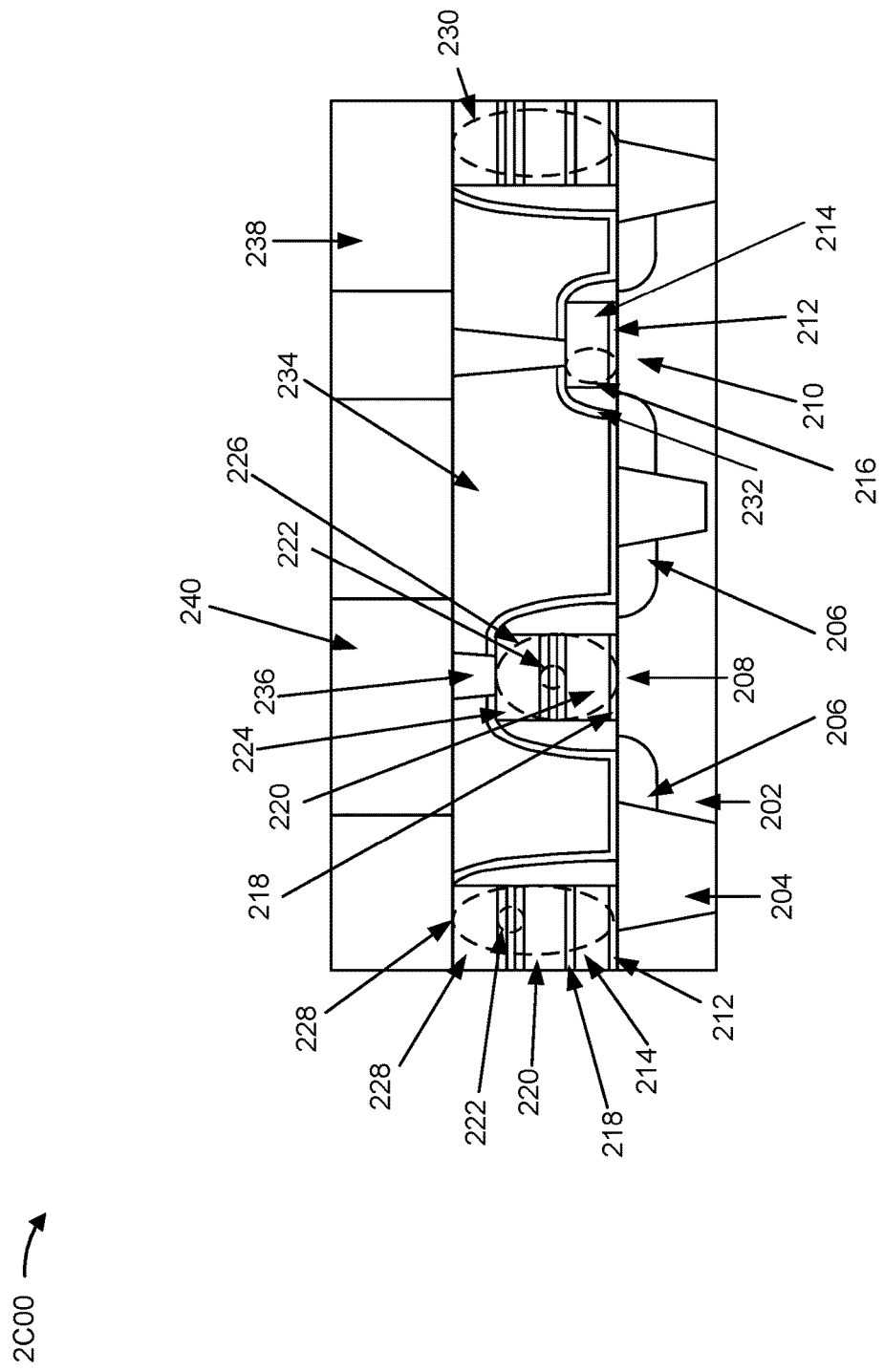

FIGS. 2A-2C are diagrams of examples of a semiconductor device 200 described herein. In some implementations, example semiconductor device 200 may include a triple-stacked polysilicon structure disposed on a substrate of the semiconductor device 200.

As shown in FIG. 2A, the semiconductor device 200 may include a substrate 202. In some implementations, the substrate 202 may include a silicon-based material. One or more trenches may be formed within the substrate 202 and may be filled with a trench isolation material 204. The trench isolation material 204 may isolate different structures of the semiconductor device 200 to, for example, avoid interference between the different structures when performing operations (e.g., a program operation, an erase operation, a read operation, among other examples).

In some implementations, the substrate may include one or more sources or drains 206 (hereinafter "source/drains"). The one or more source/drains 206 may be used to receive and/or drain voltage and/or current from active areas of the semiconductor device 200. For example, a pair of source/drains 206 may receive and drain a current across a gate stack active area 208 and/or another pair of source/drains 206 may receive and drain a current across a logic active area 210, among other examples.

In some implementations, a first dielectric layer 212 may be disposed on the substrate 202. In some implementations, the first dielectric layer 212 may be disposed on one or more portions of the substrate 202. For example, the first dielectric layer 212 may be disposed on a first portion of the substrate corresponding to the logic active area 210 and/or on a second portion (e.g., an inactive portion) of the substrate 202. In some implementations, the second dielectric layer 218 may include an oxide-based material (e.g., silicon dioxide, among other examples). A first portion of the first dielectric layer 212 and a first portion of a logic polysilicon (poly) layer 214 may form a logic polysilicon structure 216. In some implementations, the logic polysilicon structure 216 may be configured as a resistor or a switch, among other examples.

In some implementations, a second dielectric layer 218 may be disposed on the gate stack active area 208 and on the second portion of the logic polysilicon layer 214. In some implementations, the second dielectric layer 218 may include an oxide-based material (e.g., silicon dioxide, among other examples).

In some implementations, a floating gate layer 220 may be disposed on the second dielectric layer 218 (e.g., above the gate stack active area 208 and/or the second portion of the logic polysilicon layer 214). In some implementations, the second dielectric layer 218 may be configured as a tunneling oxide layer between the gate stack active area 208 and the floating gate layer 220. The floating gate layer 220 may include a polysilicon-based material or a metal gate material, among other example materials.

In some implementations, a third dielectric layer 222 may be disposed on the floating gate layer 220 (e.g., above the gate stack active area 208 and/or the second portion of the logic polysilicon layer 214). In some implementations, the third dielectric layer 222 may include one or more oxide-based sublayers and/or one or more nitride-based layers. In some implementations, the third dielectric layer 222 may include an oxide-nitride-oxide structure.

In some implementations, a control gate layer 224 may be disposed on the third dielectric layer 222 (e.g., above the gate stack active area 208 and/or the second portion of the logic polysilicon layer 214). The control gate layer 224 may include a polysilicon-based material or a metal gate material, among other examples. In some implementations, the control gate layer 224 may have a thickness that is greater than or equal to approximately 1000 angstroms to function as a CMP stop layer.

In some implementations, the second dielectric layer 218, the floating gate layer 220, the third dielectric layer 222, and/or the control gate layer 224 may be configured as a gate stack structure 226. The gate stack structure 226 may be configured to store information as a transistor and/or a flash memory device.

In some implementations, the first dielectric layer 212, the logic polysilicon layer 214, the second dielectric layer 218, the floating gate layer 220, the third dielectric layer 222, and/or the control gate layer 224 may be configured as a triple-stacked polysilicon structure. As shown in FIG. 2A, the semiconductor device 200 may include a first triple-stacked polysilicon structure 228 and a second triple-stacked polysilicon structure 230. In some implementations, the first triple-stacked polysilicon structure 228 may be separate from the second triple-stacked polysilicon structure 230 structure. In some implementations, the first triple-stacked polysilicon structure 228 and the second triple-stacked polysilicon structure 230 may be different portions of a single triple-stacked polysilicon structure. In some implementations, the first triple-stacked polysilicon structure 228 and/or the second triple-stacked polysilicon structure 230 may be configured as a dummy polysilicon structure (e.g., having no operational functions when the semiconductor device 200 is in operation), or may be configured as a resistor or a capacitor, among other example devices of the semiconductor device 200.

In some implementations, a silicon nitride layer 232 may be disposed on the logic polysilicon structure 216, the gate stack structure 226, the first triple-stacked polysilicon structure 228, the second triple-stacked polysilicon structure 230, and/or the substrate 202. In some implementations, the silicon nitride layer 232 may provide a barrier between an inter-layer dielectric 234 and the logic polysilicon structure 216, the gate stack structure 226, the first triple-stacked polysilicon structure 228, the second triple-stacked polysilicon structure 230, and/or the substrate 202. In some implementations, the silicon nitride layer 232 may reduce and/or prevent electromigration between the inter-layer dielectric 234 and one or more materials of the semiconductor device 200.

In some implementations, the inter-layer dielectric 234 may provide insulation (e.g., electrical insulation) between various structures of the semiconductor device 200. The inter-layer dielectric 234 may include a low-k material, such as a carbon-doped oxide and/or an organic polymer, among other examples.

The inter-layer dielectric 234 may be disposed between the first triple-stacked polysilicon structure 228 and the logic polysilicon structure 216 and/or the gate stack structure 226 (collectively, "one or more polysilicon-based devices"). Additionally, or alternatively, the inter-layer dielectric 234 may be disposed between the second triple-stacked polysilicon structure 230 and the one or more polysilicon-based devices. In some implementations, the inter-layer dielectric 234 may extend above the one or more polysilicon-based devices. In some implementations, the inter-layer dielectric 234 may not extend above the first triple-stacked polysilicon structure 228 and/or the second triple-stacked polysilicon structure 230. This may be based on using the first triple-stacked polysilicon structure 228 and/or the second triple-stacked polysilicon structure 230 as a stop layer for a CMP operation used to polish the inter-layer dielectric 234.

In some implementations, one or more contacts may be disposed within the inter-layer dielectric 234. The one or more contacts may include an electrically conductive material, such as a metal material (e.g., copper, tungsten, and/or cobalt, among other examples). The one or more contacts may provide a connection, from above the inter-layer dielectric 234, to at least one of the one or more polysilicon devices (e.g., to the gate stack structure 226, to the logic polysilicon structure 216, among other examples). For example, a gate stack structure contact 236 may be disposed within the inter-layer dielectric 234. The gate stack structure contact 236 may provide a connection (e.g., an electrical connection) to the gate stack structure 226 (e.g., to the control gate layer 224) through the inter-layer dielectric 234.

In some implementations, an inter-metal dielectric 238 may be disposed on the inter-layer dielectric 234. In some implementations, the inter-metal dielectric 238 may include a same type of dielectric material as the inter-layer dielectric 234. In some implementations, the inter-metal dielectric 238 may include a different type of dielectric material as the inter-layer dielectric 234.

In some implementations, one or more electrodes (e.g., metal electrodes) may be disposed within the inter-metal dielectric 238 and/or on the inter-layer dielectric 234. The one or more electrodes may include an electrically conductive material, such as a metal material (e.g., copper, tungsten, and/or cobalt, among other examples). In some implementations, the one or more electrodes may connect to at least one of the one or more polysilicon-based devices via the one or more contacts. For example, a gate stack electrode 240 may connect to the gate stack structure 226 (e.g., the control gate layer 224) via the gate stack structure contact 236.

As shown by FIG. 2B, the first triple-stacked polysilicon structure 228 and/or the second triple-stacked polysilicon structure 230 may be disposed on the trench isolation material 204. In this way, an electrical connection (e.g., a short) to the first triple-stacked polysilicon structure 228 and/or the second triple-stacked polysilicon structure 230 may not affect one or more devices (e.g., the logic polysilicon structure 216 and/or the gate stack structure 226). As shown by FIG. 2C, the first triple-stacked polysilicon 228 and/or the second triple-stacked polysilicon structure 230 may be disposed partially on the trench isolation material 204 and partially on an inactive area of the substrate 202. In this way, an electrical connection (e.g., a short) to the first triple-stacked polysilicon structure 228 and/or the second triple-stacked polysilicon structure 230 may not affect one or more devices (e.g., the logic polysilicon structure 216 and/or the gate stack structure 226).

Based on the semiconductor device 200 including the first triple-stacked polysilicon structure 228 and/or the second triple-stacked polysilicon structure 230 having a first height that is greater than heights of the one or more polysilicon-based devices, the first triple-stacked polysilicon structure 228 and/or the second triple-stacked polysilicon structure 230 may be used as a stop layer for a CMP operation to planarize the inter-layer dielectric 234 in a manufacturing process. In this way, a portion of the inter-layer dielectric 234 may be disposed above the one or more polysilicon-based devices after the CMP operation and the portion of the inter-layer dielectric 234 may provide a layer of insulation between the one or more polysilicon-based devices and an electrode on the inter-layer dielectric 234. This may reduce or prevent shorting between the one or more polysilicon-based devices and the electrode, which may reduce defects from the manufacturing process.

As indicated above, FIGS. 2A-2C are provided as examples. Other examples may differ from what is described with regard to FIGS. 2A-2C. The number and arrangement of devices shown in FIGS. 2A-2C are provided as an example. In practice, there may be additional devices, fewer devices, different devices, or differently arranged devices than those shown in FIGS. 2A-2C. For example, the first triple-stacked polysilicon structure 228 and/or the second triple-stacked polysilicon structure 230 may be formed as shown in FIGS. 2A-2C. Alternatively, the first triple-stacked polysilicon structure 228 and/or the second triple-stacked polysilicon structure 230 may be formed with the second dielectric layer 218 on the substrate 202, the floating gate layer 220 on the second dielectric layer 218, the third dielectric layer 222 on the floating gate layer 220, the control gate layer 224 on the third dielectric layer 222, the first dielectric layer 212 on the control gate layer 224, and/or the logic polysilicon layer 214 on the first dielectric layer 212. In other words, the logic polysilicon layer 214 may be a top layer of the first triple-stacked polysilicon structure 228 and/or the second triple-stacked polysilicon structure 230. In some implementations in which the logic polysilicon layer 214 is the top layer of the first triple-stacked polysilicon structure 228, the logic polysilicon layer 214 may have a thickness that is greater than or equal to approximately 1000 angstroms to function as a CMP stop layer. Additionally, or alternatively, the logic polysilicon layer 214, the floating gate layer 220, and/or the control gate layer 224 may include a metal material (e.g., a metal gate material) and/or may not include a polysilicon material, among other examples.

FIGS. 3A-3H are diagrams of one or more example implementations described herein. Example implementation(s) may include one or more example implementations of a process for manufacturing a semiconductor device 200 (e.g., a transistor), as described herein.

Figure 3A:
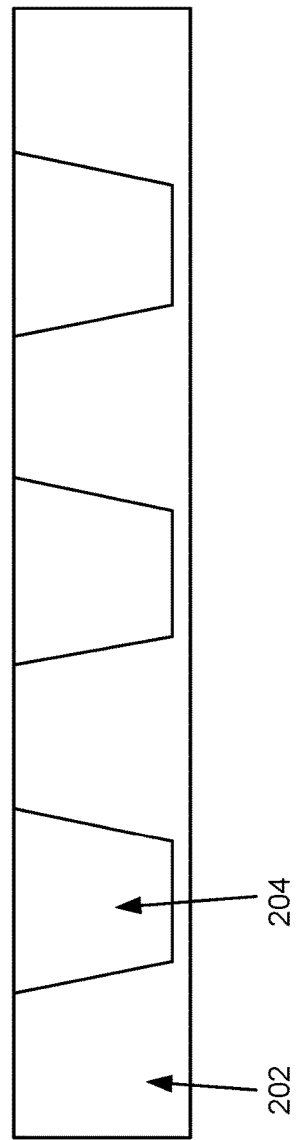
FIGS. 3A-3H are diagrams of example implementations described herein.

As shown in FIG. 3A, the semiconductor device 200 may include a substrate 202 and trench isolation material 204 embedded in the substrate 202. In some implementations, the substrate 202 may include a silicon-based material. In some implementations, the trench isolation material 204 may include one or more dielectric materials (e.g., silicon dioxide).

In some implementations, an etching tool (e.g., etching tool 104) may etch a portion of the substrate 202 to form one or more shallow trenches. In some implementations, a deposition tool (e.g., deposition tool 102) may deposit the trench isolation material 204 into the one or more shallow trenches to provide shallow trench isolation (STI) to isolate surfaces of the substrate 202. In some implementations, the deposition tool may use chemical vapor deposition or physical vapor deposition, among other examples, to deposit the trench isolation material 204 into the one or more shallow trenches of the substrate 202. In some implementations, a CMP tool (e.g., CMP tool 106) may planarize an upper surface of the substrate 202 and/or the trench isolation material 204.

Figure 3B:
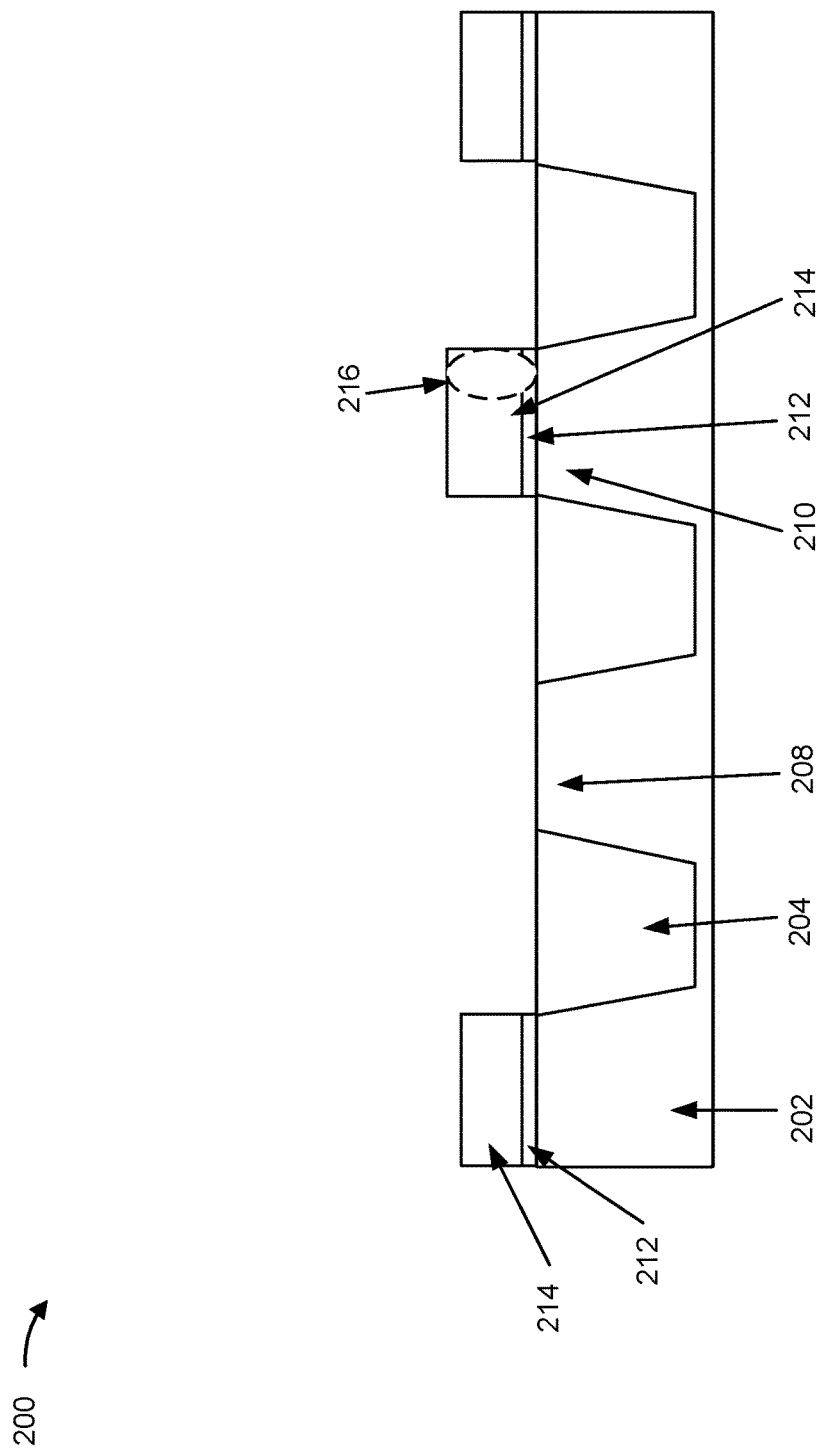

As shown in FIG. 3B, a deposition tool (e.g., deposition tool 102) may deposit a first dielectric layer 212 on one or more portions of the substrate 202 and/or on one or more portions of the trench isolation material 204. As also shown in FIG. 3B, a deposition tool (e.g., deposition tool 102) may deposit a logic polysilicon (poly) layer 214 on the first dielectric layer 212. In some implementations, the deposition tool may use chemical vapor deposition or physical vapor deposition, among other examples, to deposit the first dielectric layer 212 on the one or more portions of the substrate 202 and/or the one or more portions of the trench isolation material 204 and/or to deposit the logic polysilicon layer 214 on the first dielectric layer 212. As further shown in FIG. 3B, a portion of the first dielectric layer 212 and a portion of the logic polysilicon layer 214 may form a logic polysilicon structure 216.

In some implementations, a process for depositing the first dielectric layer 212 and the logic polysilicon layer 214 may include multiple operations. The operations may include, for example, depositing a layer of dielectric material on the substrate 202 and on the trench isolation material 204 and depositing a layer of polysilicon material on the layer of dielectric material. The operations may also include depositing a photoresist material on one or more portions of the layer of polysilicon material and etching remaining portions of the layer of polysilicon material to form the first dielectric layer 212 on the one or more portions of the substrate 202 and the logic polysilicon layer 214 on the first dielectric layer 212.

As further shown in FIG. 3B, the substrate 202 may include a gate stack active area 208 on which a gate stack structure is to be formed, a logic active area 210 on which the logic polysilicon structure 216 is to be formed. In some implementations, one or more portions of the substrate 202 may include source/drains (not shown) to receive and/or drain charge from active areas of the substrate 202.

Figure 3C:
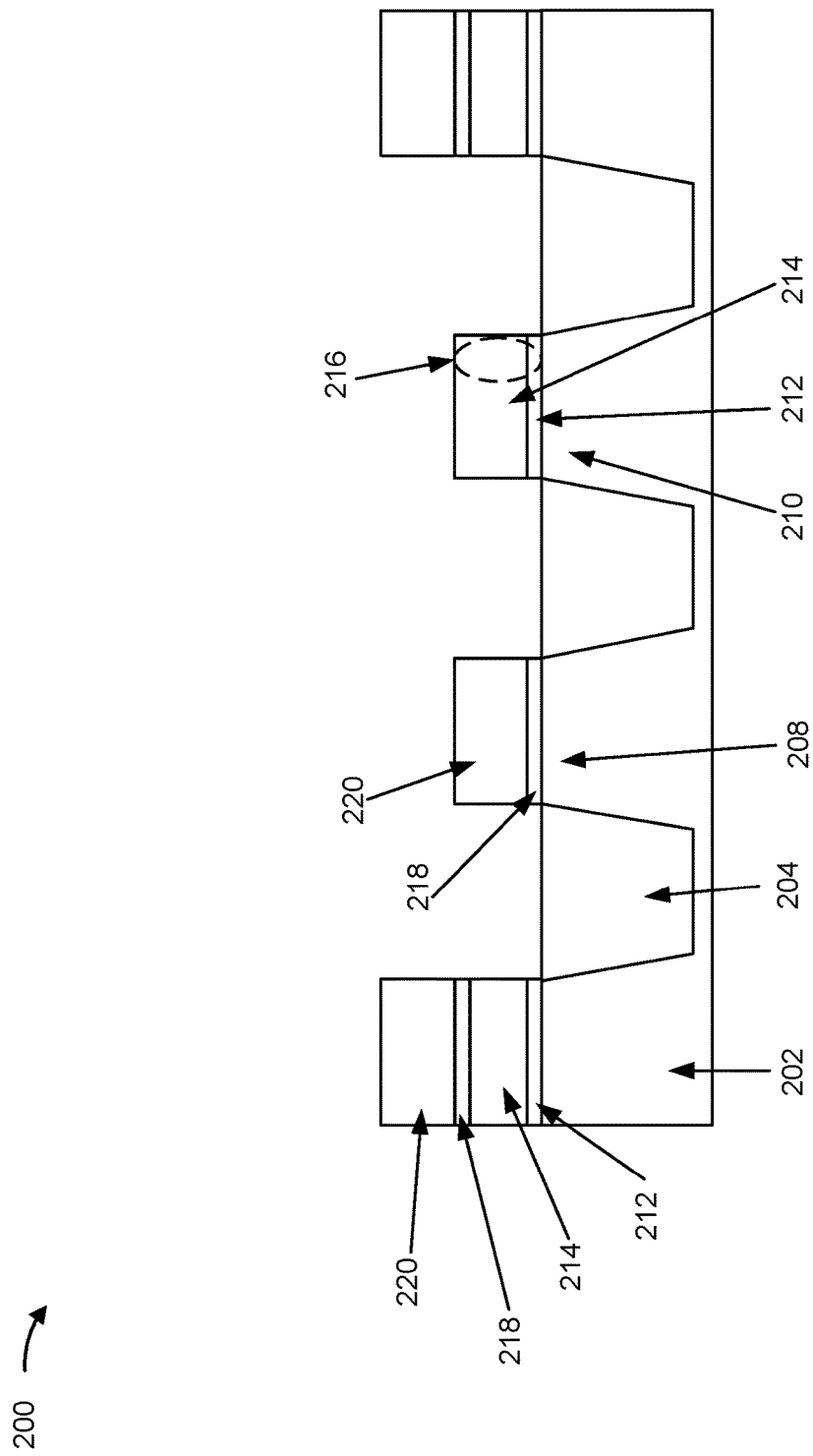

As shown in FIG. 3C, a deposition tool (e.g., deposition tool 102) may deposit a second dielectric layer 218 on the gate stack active area 208 of the substrate 202 and/or on the logic polysilicon layer 214 above a portion of the substrate 202 that is outside of the logic active area 210. As also shown in FIG. 3C, a deposition tool (e.g., deposition tool 102) may deposit a floating gate layer 220 on the second dielectric layer 218. In some implementations, the deposition tool may use chemical vapor deposition or physical vapor deposition, among other examples, to deposit the floating gate layer 220 on the second dielectric layer 218 and to deposit the second dielectric layer 218 on the gate stack active area 208 of the substrate 202 and/or on the logic polysilicon layer 214 above the portion of the substrate 202 that is outside of the logic active area 210.

In some implementations, a process for depositing the second dielectric layer 218 and the floating gate layer 220 may include multiple operations. The operations may include, for example, depositing a layer of dielectric material on the substrate 202 and on the logic polysilicon layer 214 and depositing a layer of polysilicon material on the layer of dielectric material. The operations may also include depositing a photoresist material on one or more portions of the layer of polysilicon material and etching remaining portions of the layer of polysilicon material to form the floating gate layer 220 on the second dielectric layer 218 and to form the second dielectric layer 218 on the gate stack active area 208 of the substrate 202 and/or on the logic polysilicon layer 214 above a portion of the substrate 202 that is outside of the logic active area 210.

Figure 3D:
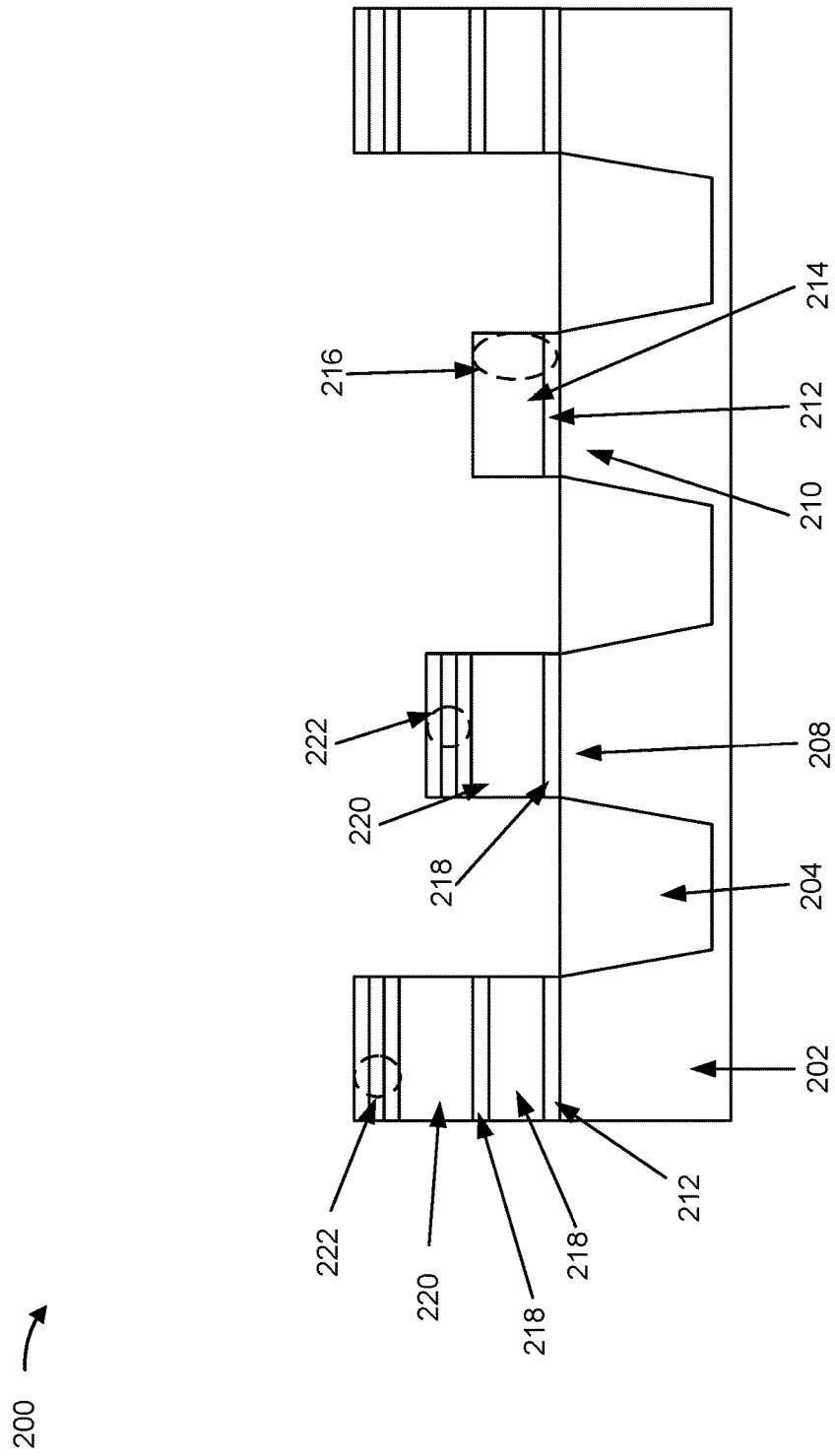

As shown in FIG. 3D, a deposition tool (e.g., deposition tool 102) may deposit a third dielectric layer 222 on the floating gate layer 220 (e.g., above the gate stack active area 208 and above a portion of the substrate 202 that is outside of the logic active area 210). In some implementations, the deposition tool may use chemical vapor deposition or physical vapor deposition, among other examples, to deposit the third dielectric layer 222 on the floating gate layer 220.

In some implementations, a process for depositing the third dielectric layer 222 may include multiple operations. The operations may include, for example, depositing a layer of dielectric material on the substrate 202, on the logic polysilicon structure 216, and on the floating gate layer 220. The operations may also include depositing a photoresist material on one or more portions of the dielectric material and etching remaining portions of the dielectric material to form the third dielectric layer 222 on the floating gate layer 220. In some implementations, depositing the layer of dielectric material may include depositing a first oxide-based layer on the substrate 202, on the logic polysilicon structure 216, and on the floating gate layer 220, depositing a nitride-based layer on the first oxide-based layer, and depositing a second oxide-based layer on the nitride-based layer to form an oxide-nitride-oxide structure.

Figure 3E:
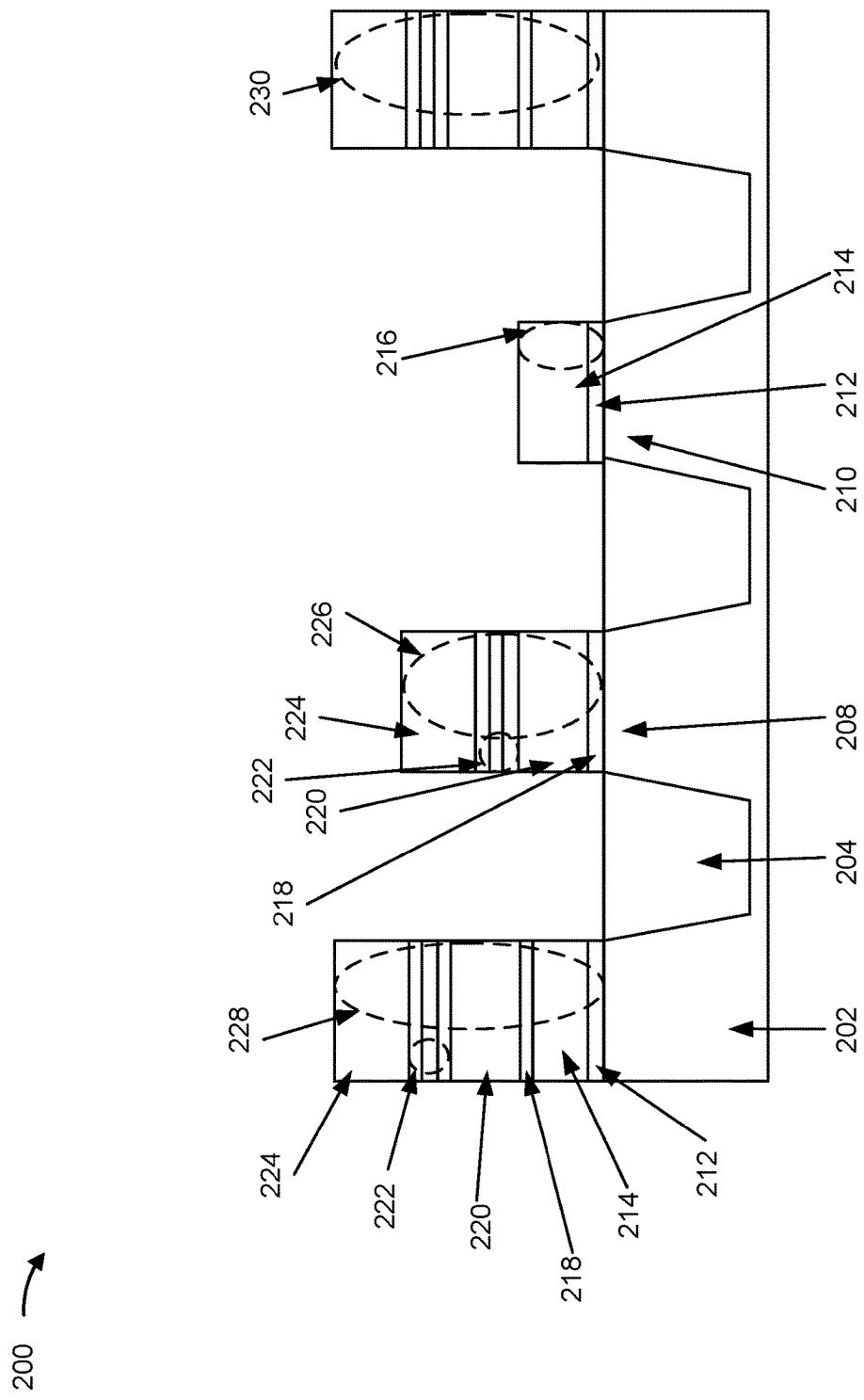

As shown in FIG. 3E, a deposition tool (e.g., deposition tool 102) may deposit a control gate layer 224 on the third dielectric layer 222 (e.g., above the gate stack active area 208 and above a portion of the substrate 202 that is outside of the logic active area 210). In some implementations, the deposition tool may use chemical vapor deposition or physical vapor deposition, among other examples, to deposit the control gate layer 224 on the third dielectric layer 222.

In some implementations, a process for depositing the control gate layer 224 may include multiple operations. The operations may include, for example, depositing a layer of polysilicon material on the substrate 202, on the logic polysilicon structure 216, and on the third dielectric layer 222. The operations may also include depositing a photoresist material on one or more portions of the polysilicon material and etching remaining portions of the polysilicon material to form the control gate layer 224 on the third dielectric layer 222.

As further shown in FIG. 3E, a gate stack structure 226 may be formed on the gate stack active area 208 as a stack of materials including the second dielectric layer 218, the floating gate layer 220, the third dielectric layer 222, and the control gate layer 224. Additionally, or alternatively, a first triple-stacked polysilicon structure 228 may be formed on a portion of the substrate 202 and/or the trench isolation material 204 (e.g., outside of active areas of the substrate 202). The first triple-stacked polysilicon structure 228 may include the first dielectric layer 212, the logic polysilicon layer 214, the second dielectric layer 218, the floating gate layer 220, the third dielectric layer 222, and/or the control gate layer 224, among other examples. In some implementations, a second triple-stacked polysilicon structure 230 may include the first dielectric layer 212, the logic polysilicon layer 214, the second dielectric layer 218, the floating gate layer 220, the third dielectric layer 222, and/or the control gate layer 224, among other examples.

In some implementations, a height of the first triple-stacked polysilicon structure 228 and/or the second triple-stacked polysilicon structure 230 may be greater than heights of the logic polysilicon structure 216 and/or the gate stack structure 226. In some implementations, the first triple-stacked polysilicon structure 228 may be spaced from the second triple-stacked polysilicon structure 230 with a distance that is less than or equal to approximately 150 micrometers. In some implementations, the spacing may reduce dishing (e.g., a depression in a dielectric material disposed between the first triple-stacked polysilicon structure 228 and the second triple-stacked polysilicon structure 230).

Figure 3F:
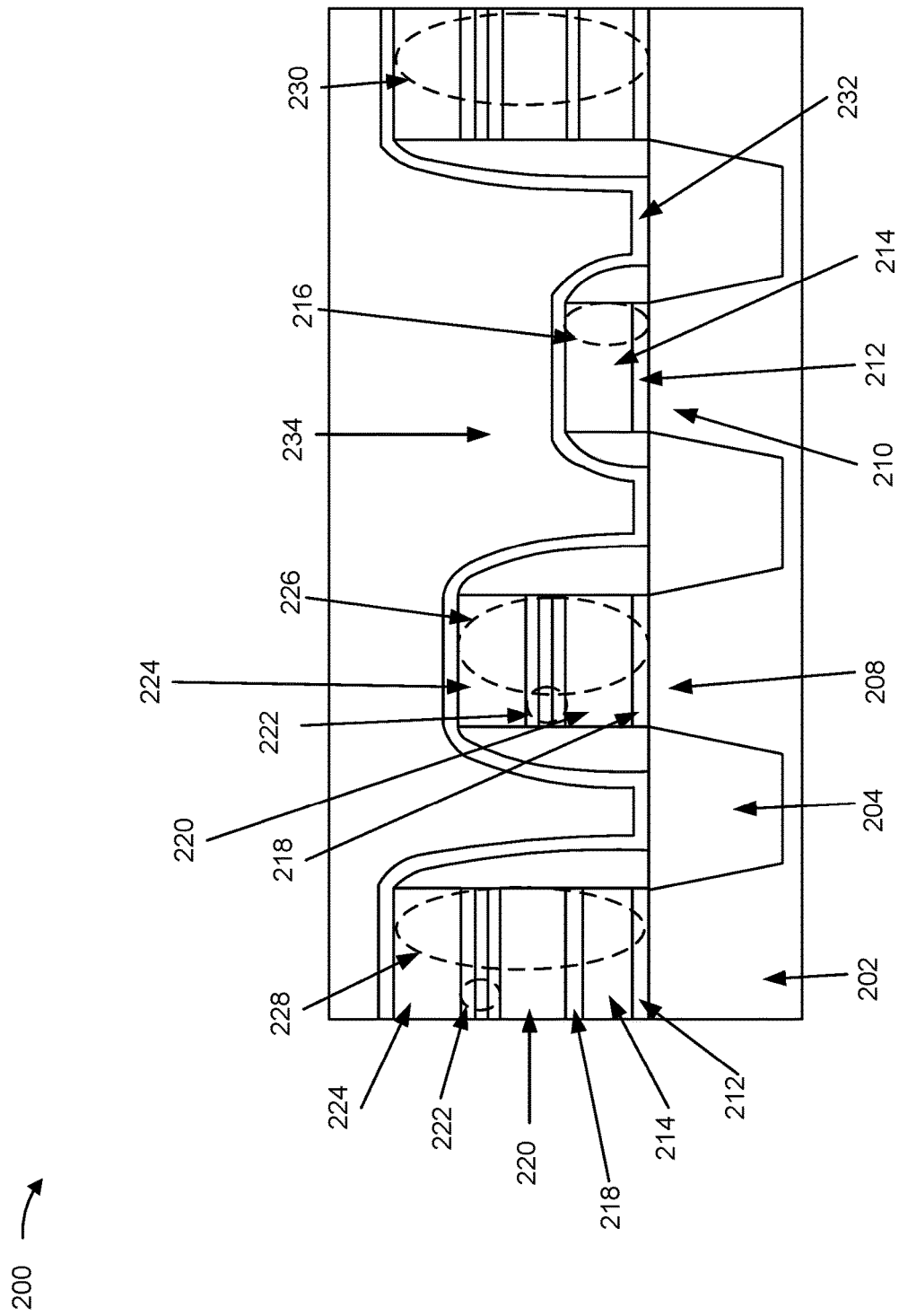

As shown in FIG. 3F, a deposition tool (e.g., deposition tool 102) may deposit a silicon nitride layer 232 on the substrate 202, on the trench isolation material 204, on the first triple-stacked polysilicon structure, on the second triple-stacked polysilicon structure 230, on the logic polysilicon structure 216, and/or on the gate stack structure 226. As also shown in FIG. 3F, a deposition tool (e.g., deposition tool 102) may deposit an inter-layer dielectric 234 on the silicon nitride layer 232. In some implementations, the deposition tool may use chemical vapor deposition or physical vapor deposition, among other examples, to deposit the inter-layer dielectric 234 on the silicon nitride layer 232 and to deposit the silicon nitride layer 232 on the substrate 202, on the trench isolation material 204, the first triple-stacked polysilicon structure, the second triple-stacked polysilicon structure 230, the logic polysilicon structure 216, and/or the gate stack structure 226.

Figure 3G:
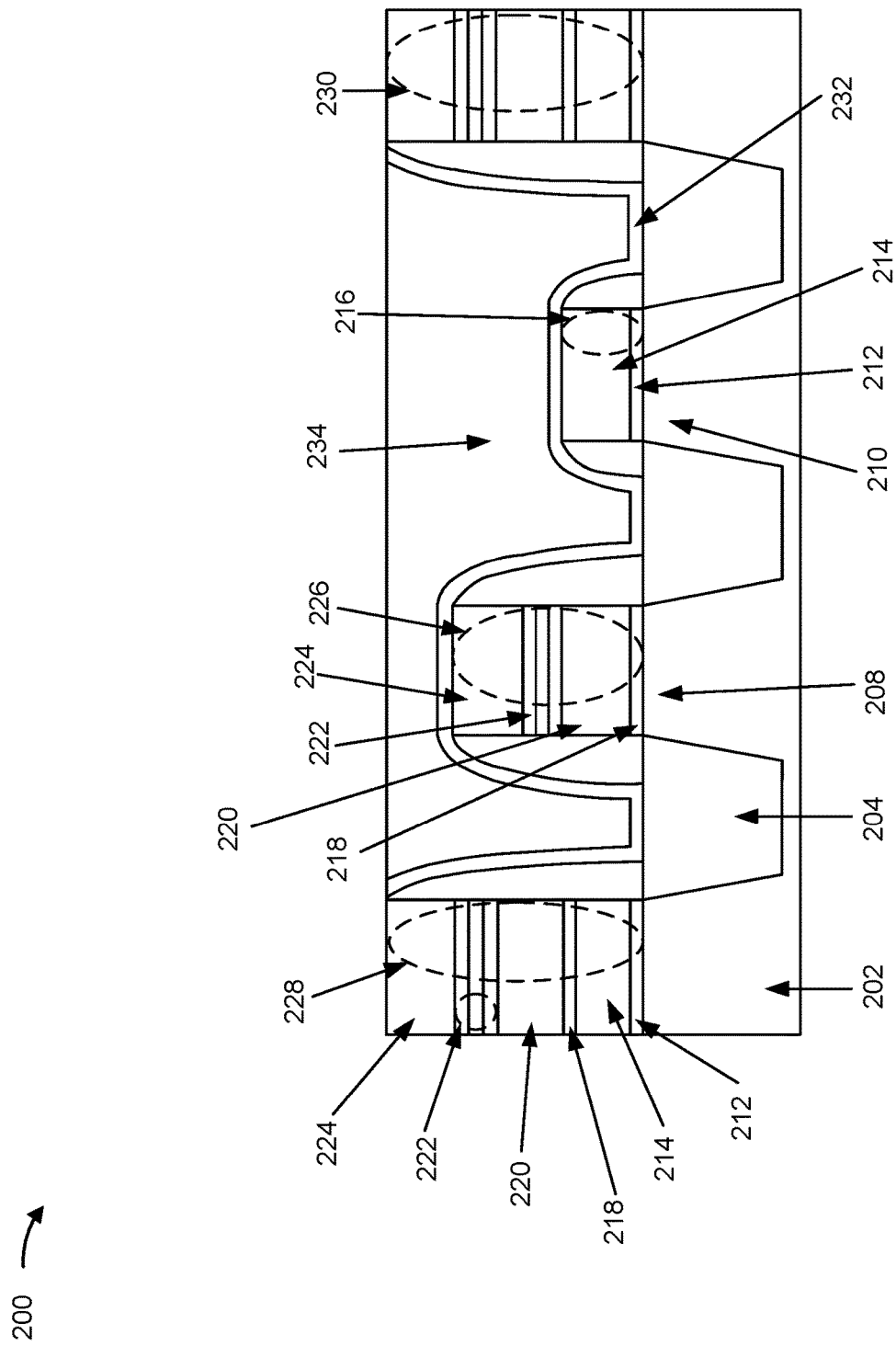

As shown in FIG. 3G, a CMP tool (e.g., CMP tool 106) may planarize an upper surface of the inter-layer dielectric 234. In some implementations, the CMP tool may perform a planarization operation to polish material from the semiconductor device 200 until a stop layer is reached (e.g., in an end point mode). The stop layer may be configured as the control gate layer 224 of the first triple-stacked polysilicon structure 228 and/or the control gate layer 224 of the second triple-stacked polysilicon structure 228.

As further shown in FIG. 3G, after performing the CMP process, a portion of the inter-layer dielectric 234 is disposed above the gate stack structure 226 and/or the logic polysilicon structure 216. In this way, an electrode disposed on the inter-layer dielectric 234 may be insulated from the gate stack structure 226 and/or the logic polysilicon structure 216, which may reduce shorting and/or defects from the manufacturing process.

Figure 3H:
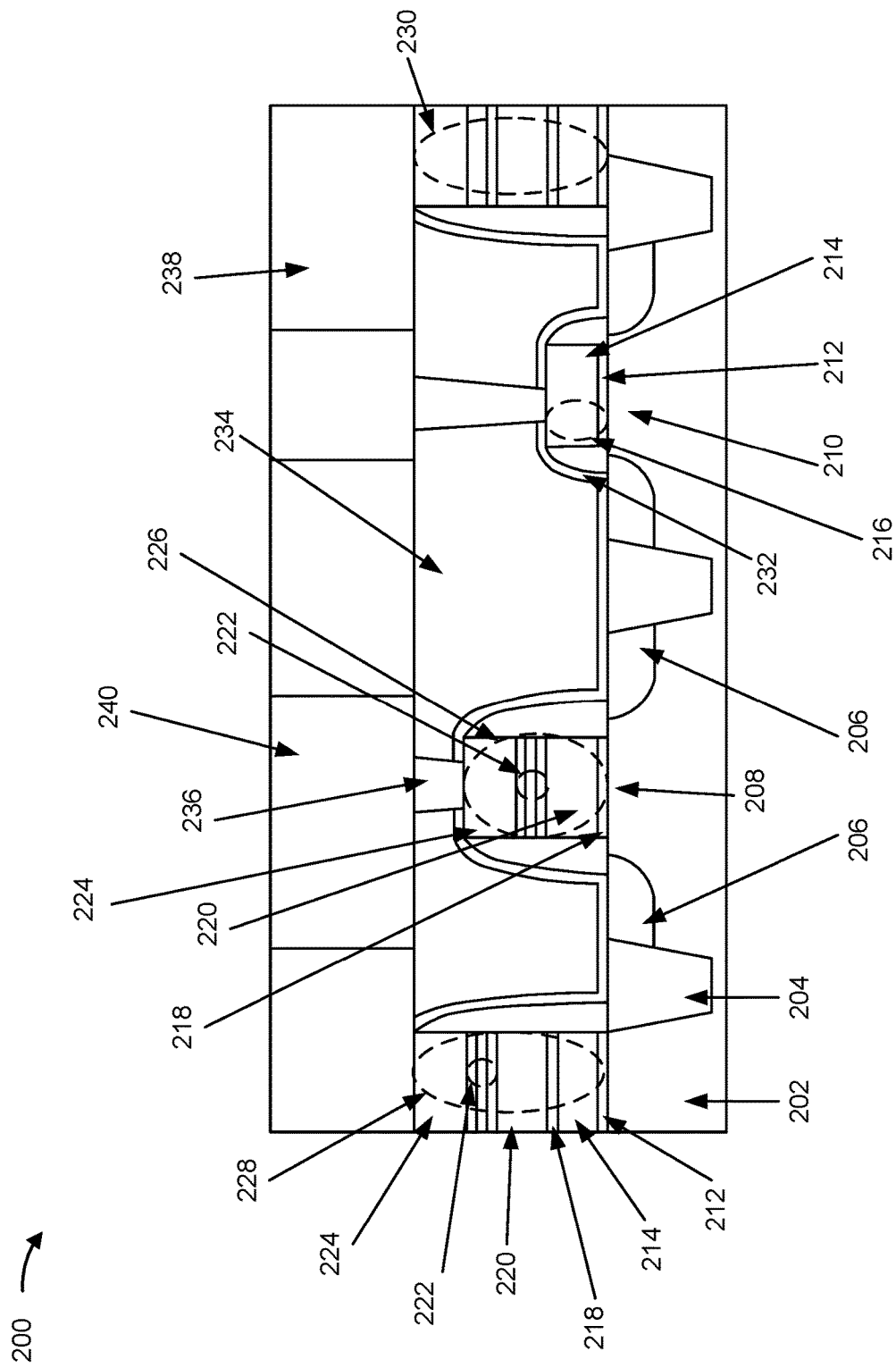

As shown in FIG. 3H, a deposition tool (e.g., deposition tool 102) may deposit a gate stack structure contact 236 and/or one or more additional contacts within a via of the inter-layer dielectric 234. The gate stack structure contact 236 and/or one or more additional contacts may provide connections to one or more structures within the inter-layer dielectric 234 (e.g., the gate stack structure 236 and/or the logic polysilicon structure 216).

In some implementations, a process for depositing the gate stack structure contact 236 and/or one or more additional contacts may include multiple operations. The operations may include, for example, depositing a photoresist material on one or more portions of the inter-layer dielectric 234 and etching remaining portions of the inter-layer dielectric 234 to form one or more vias. The operations may further include depositing contact material (e.g., a metal-based material) within the one or more vias to form the gate stack structure contact 236 and/or one or more additional contacts.

As also shown in FIG. 3H, a deposition tool (e.g., deposition tool 102) may deposit an inter-metal dielectric 238 on the inter-layer dielectric 234 and/or on the gate stack structure contact 236 and/or one or more additional contacts. In some implementations, the deposition tool may use chemical vapor deposition or physical vapor deposition, among other examples, to deposit the inter-metal dielectric 238 on the inter-layer dielectric 234 and/or on the gate stack structure contact 236 and/or one or more additional contacts.

As further shown in FIG. 3H, a deposition tool (e.g., deposition tool 102) may deposit a gate stack electrode 240 and/or one or more additional electrodes within a via of the inter-metal dielectric 238. The gate stack electrode 240 and/or one or more additional electrodes may provide connections to one or more structures within the inter-layer dielectric 234 (e.g., the gate stack structure 236 and/or the logic polysilicon structure 216) through the gate stack structure contact 236 and/or the one or more additional contacts.

In some implementations, a process for depositing the gate stack electrode 240 and/or one or more additional electrodes may include multiple operations. The operations may include, for example, depositing a photoresist material on one or more portions of the inter-metal dielectric 238 and etching remaining portions of the inter-metal dielectric 238 to form one or more vias. The operations may further include depositing electrode material (e.g., a metal-based material) within the one or more vias to form the gate stack electrode 240 and/or one or more additional electrodes.

As indicated above, FIGS. 3A-3H are provided as an example. Other examples may differ from what is described with regard to FIGS. 3A-3H. The number and arrangement of devices, layers, and/or materials shown in FIGS. 3A-3H are provided as an example. In practice, there may be additional devices, layers, and/or materials, fewer devices, layers, and/or materials, different devices, layers, and/or materials, or differently arranged devices, layers, and/or materials than those shown in FIGS. 3A-3H. For example, in some implementations, the second dielectric layer 218, the floating gate layer 220, the third dielectric layer 222, and/or the control gate layer 224 may be deposited before the first dielectric layer 212 and/or the logic polysilicon layer 214. In some implementations in which the logic polysilicon layer 214 is deposited as a top layer of the first triple-stacked polysilicon structure 228 and/or the second triple-stacked polysilicon structure 230, the logic polysilicon layer 214 may be configured as the stop layer for the CMP operation.

FIGS. 4A-4F are diagrams of example semiconductor structures described herein. FIGS. 4A-4F show the example semiconductor structures, having one or more triple-stacked polysilicon structures 228 and/or one or more triple-stacked polysilicon structures 230, from a top view. The one or more one or more triple-stacked polysilicon structures will be referred to generally as "one or more triple-stacked polysilicon structures 228" or something similar even though any of the one or more triple-stacked polysilicon structures may correspond to triple-stacked polysilicon structure 230.

Figure 4A:
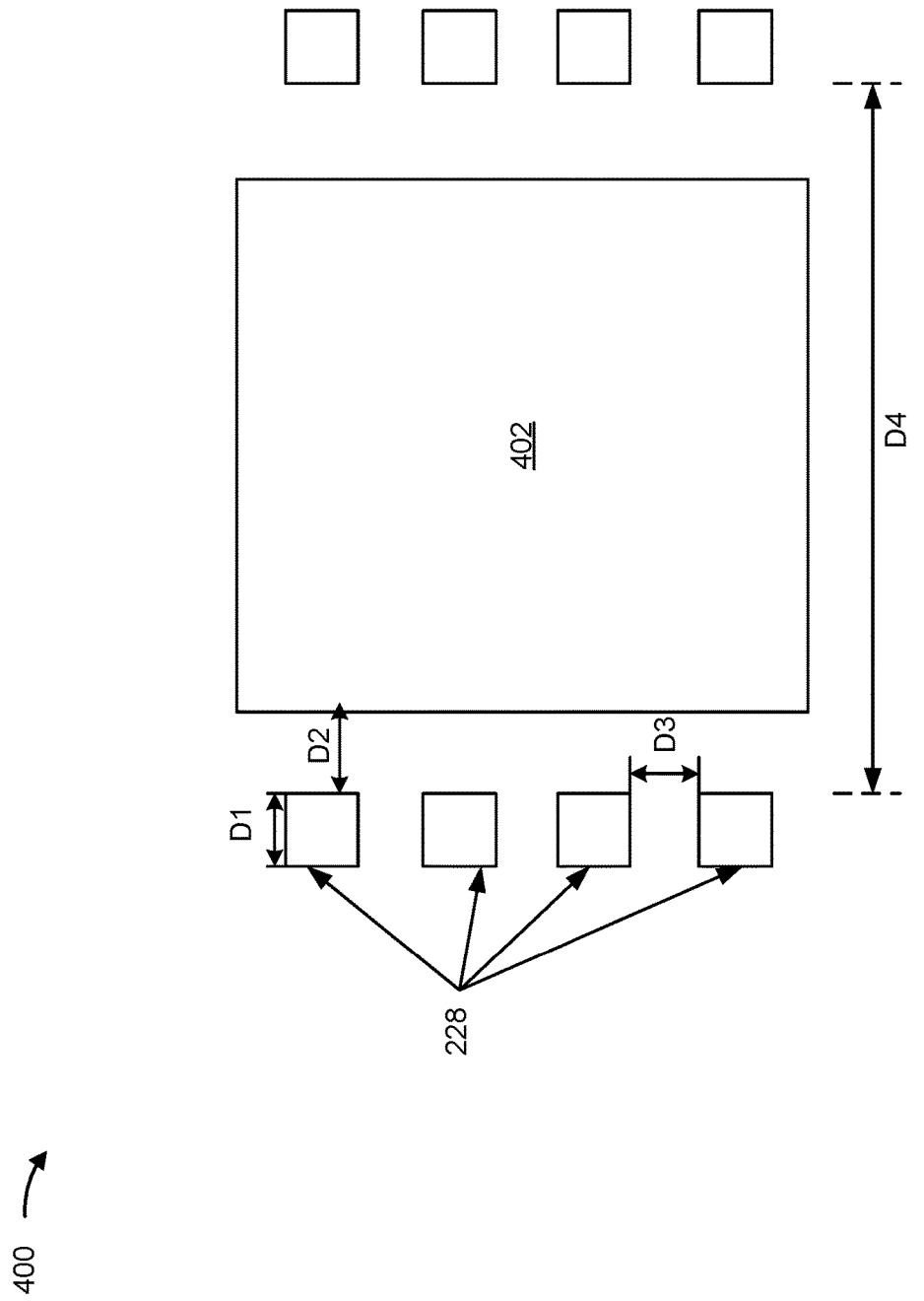
FIGS. 4A-4F are diagrams of example semiconductor structures described herein.

As shown in FIG. 4A, semiconductor device 400A may include multiple triple-stacked polysilicon structures 228 having lengths and/or widths D1, spaced from a polysilicon-based device 402 (e.g., the logic polysilicon structure 216) with a distance D2, and spaced from other triple-stacked polysilicon structures 228 with a distance D3. A first set of triple-stacked polysilicon structures 228 (e.g., on a first side of the polysilicon-based device 402) may be spaced from another set of triple-stacked polysilicon structures 228 (e.g., on a second side of the polysilicon-based device 402) with a distance D4.

In some implementations, D1 may be greater than or equal to approximately 0.06 micrometers and/or an area of the triple-stacked polysilicon structures 228 may be greater than or equal to approximately 0.042 square micrometers. In some implementations, D2 and/or D3 may be greater than or equal to approximately 0.12 micrometers. In some implementations, D4 may be less than or equal to approximately 150 micrometers.

Figure 4B:
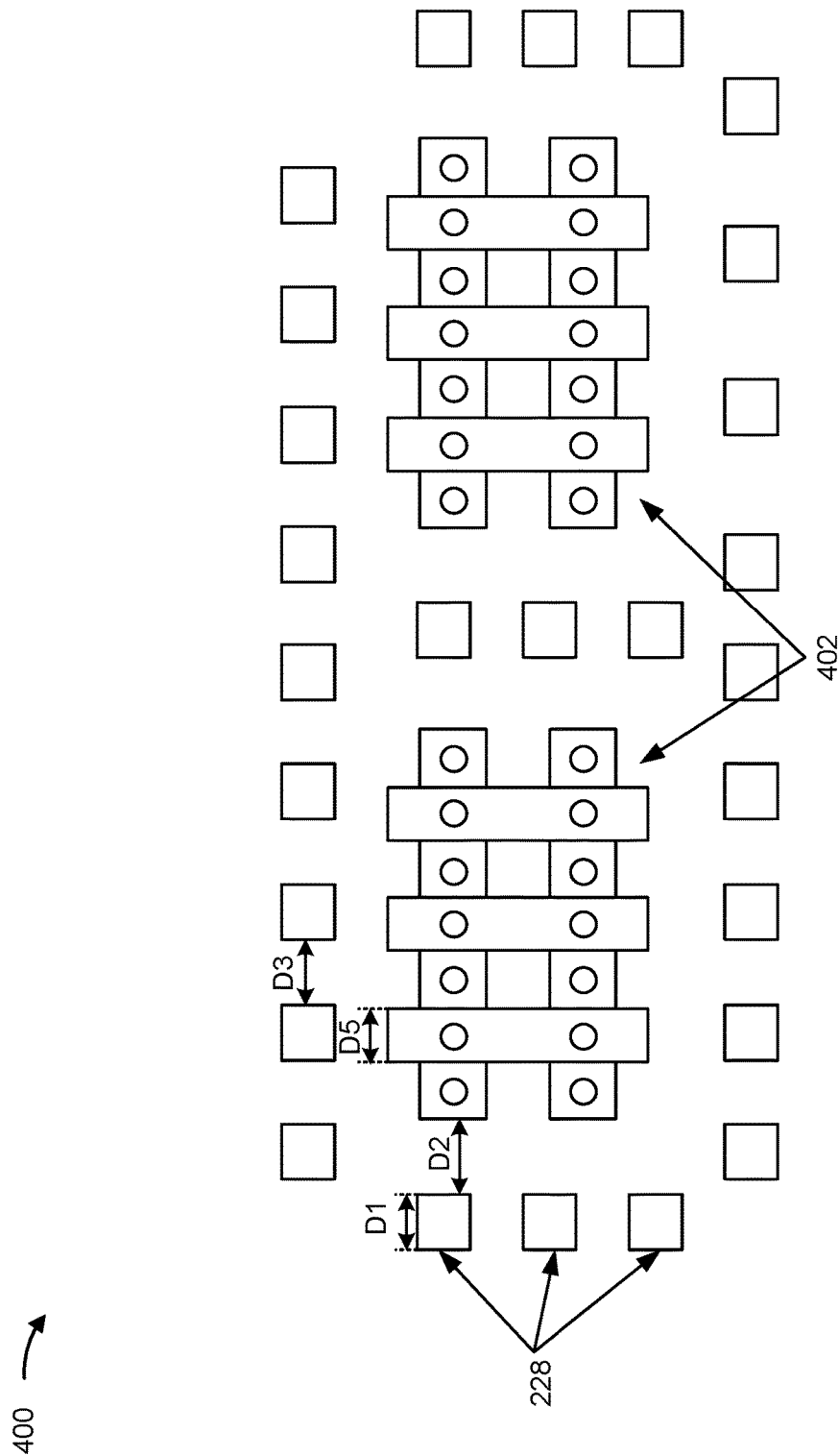

As shown in FIG. 4B, semiconductor device 400B may include multiple triple-stacked polysilicon structures 228 having lengths and/or widths D1, spaced from multiple polysilicon-based devices 402 (e.g., the logic polysilicon structure 216) with a distance D2, and spaced from other triple-stacked polysilicon structures 228 with a distance D3. The triple-stacked polysilicon structures 228 may surround each of the multiple polysilicon-based devices 402 and/or may be disposed between the multiple polysilicon-based devices 402.

In some implementations, D1 may be greater than or equal to approximately 0.06 micrometers and/or an area of the triple-stacked polysilicon structures 228 may be greater than or equal to approximately 0.042 square micrometers. In some implementations, D1 may be greater than or equal to a width D5 of polysilicon-based material in the polysilicon-based devices 402. In some implementations, D2 and/or D3 may be greater than or equal to approximately 0.12 micrometers.

Figure 4C:
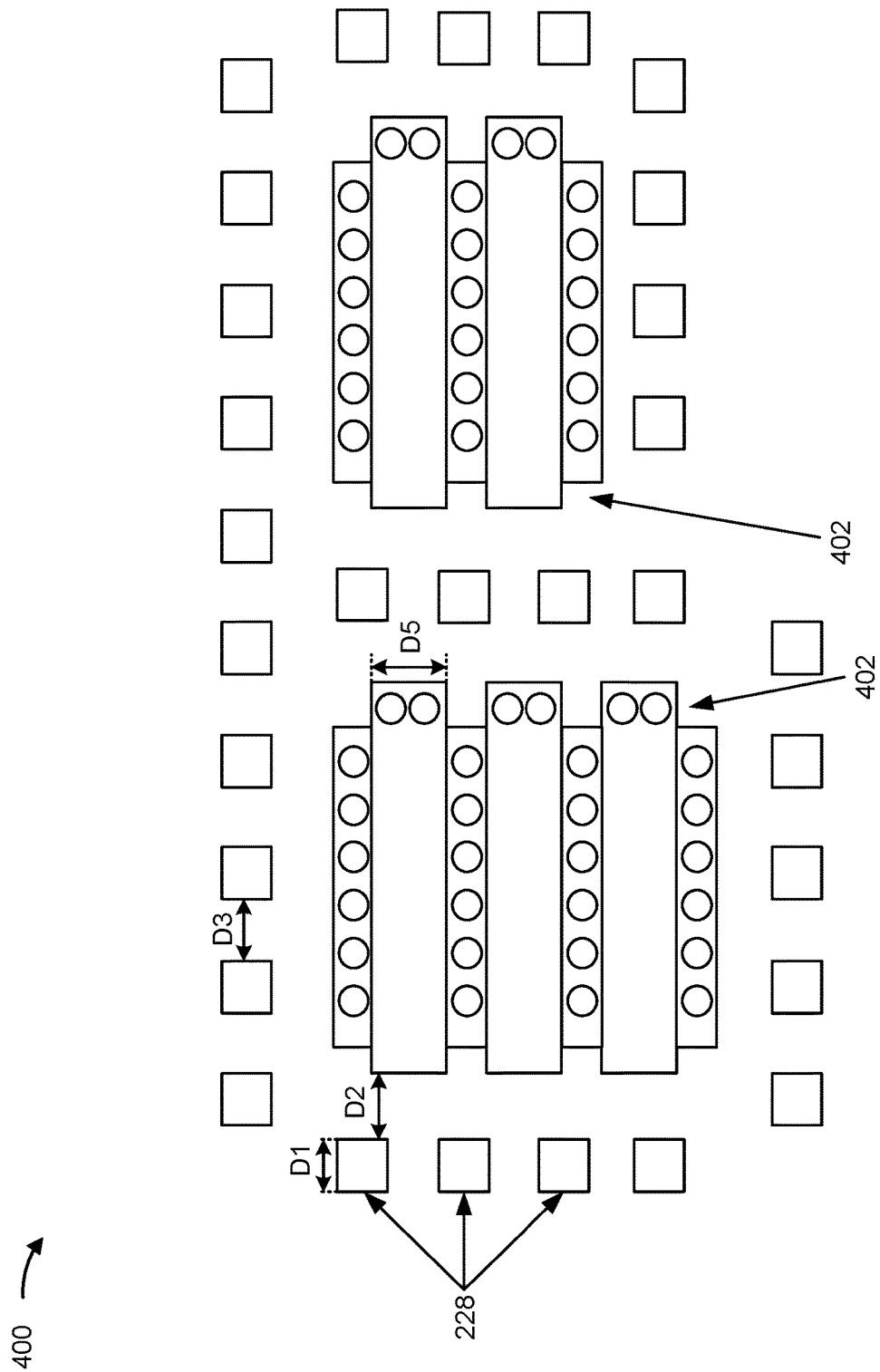

As shown in FIG. 4C, semiconductor device 400C may include multiple triple-stacked polysilicon structures 228 having lengths and/or widths D1, spaced from multiple polysilicon-based devices 402 (e.g., the logic polysilicon structure 216) with a distance D2, and spaced from other triple-stacked polysilicon structures 228 with a distance D3. The triple-stacked polysilicon structures 228 may surround each of the multiple polysilicon-based devices 402 and/or may be disposed between the multiple polysilicon-based devices 402. As shown in FIG. 3C, the polysilicon-based devices 402 may have different sizes and/or may have different functions.

In some implementations, D1 may be greater than or equal to approximately 0.06 micrometers and/or an area of the triple-stacked polysilicon structures 228 may be greater than or equal to approximately 0.042 square micrometers. In some implementations, D1 may be greater than or equal to a width D5 polysilicon-based material in the polysilicon-based devices 402. In some implementations, D2 and/or D3 may be greater than or equal to approximately 0.12 micrometers.

Figure 4D:
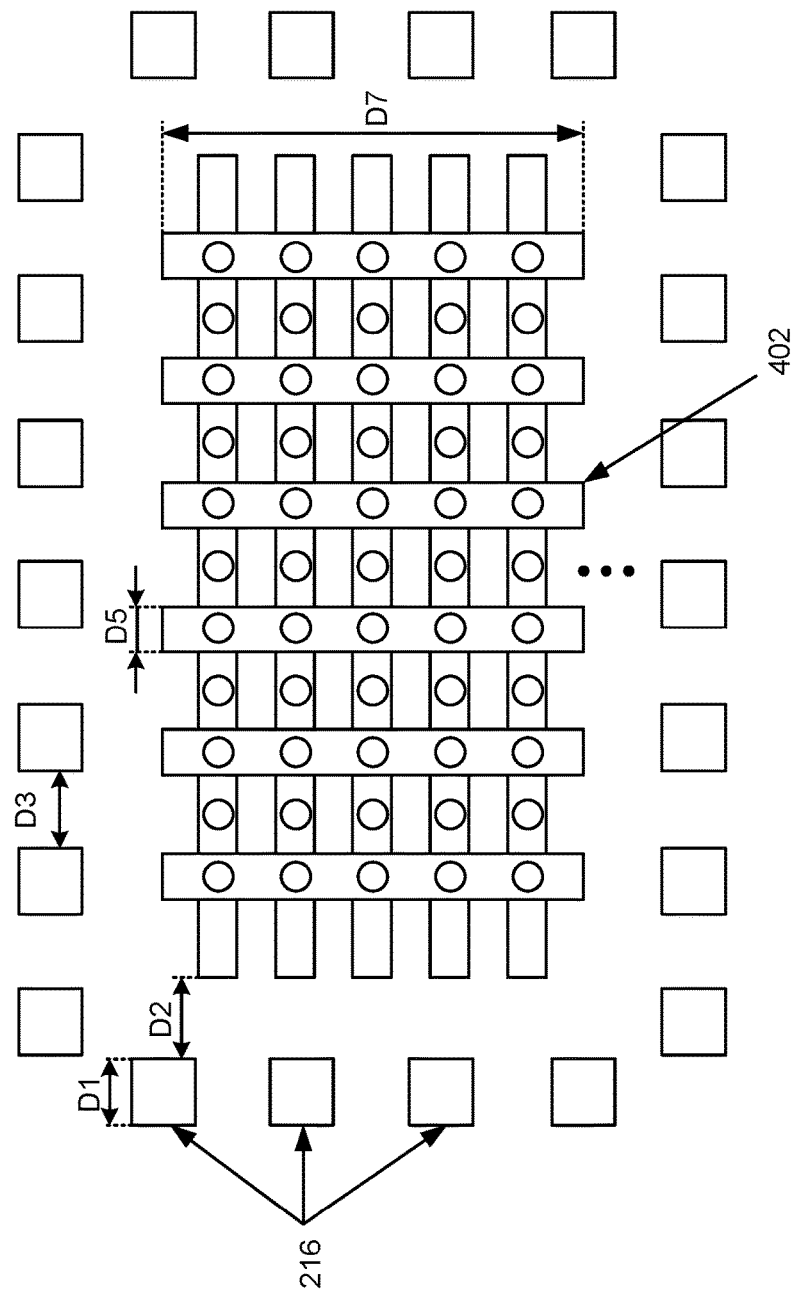

As shown in FIG. 4D, semiconductor device 400D may include multiple triple-stacked polysilicon structures 228 having lengths and/or widths D1, spaced from a polysilicon-based device 402 (e.g., the gate stack structure 226) with a distance D2, and spaced from other triple-stacked polysilicon structures 228 with a distance D3. The triple-stacked polysilicon structures 228 may surround the polysilicon-based device 402.

In some implementations, D1 may be greater than or equal to approximately 0.06 micrometers and/or an area of the triple-stacked polysilicon structures 228 may be greater than or equal to approximately 0.042 square micrometers. In some implementations, D1 may be greater than or equal to a width D5 of polysilicon-based material in the polysilicon-based device 402 (e.g., a lesser of a width in an X direction or a width in a Y direction). In some implementations, D2 and/or D3 may be greater than or equal to approximately 0.12 micrometers.

Figure 4E:
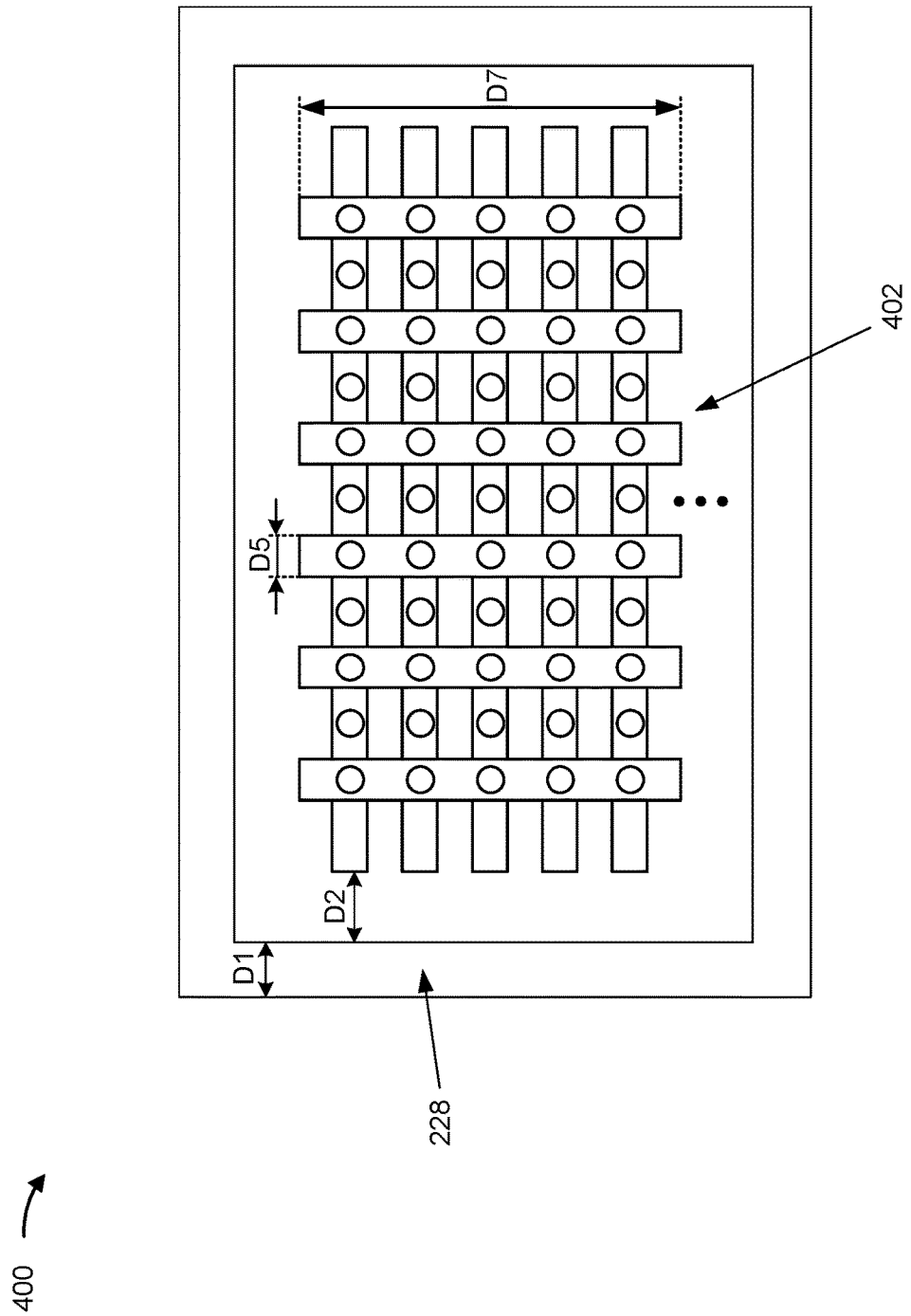

As shown in FIG. 4E, semiconductor device 400E may include a single triple-stacked polysilicon structure 228 having a width D1, spaced from a polysilicon-based device 402 (e.g., the gate stack structure 226) with a distance D2. The triple-stacked polysilicon structure 228 may surround the polysilicon-based device 402 in a polygonal shape and/or a curved shape, among other examples.

In some implementations, D1 may be greater than or equal to approximately 0.06 micrometers. In some implementations, D1 may be greater than or equal to a width D5 of polysilicon-based material in the polysilicon-based device 402 (e.g., a lesser of a width in an X direction or a width in a Y direction). In some implementations, D2 and/or D3 may be greater than or equal to approximately 0.12 micrometers.

Figure 4F:
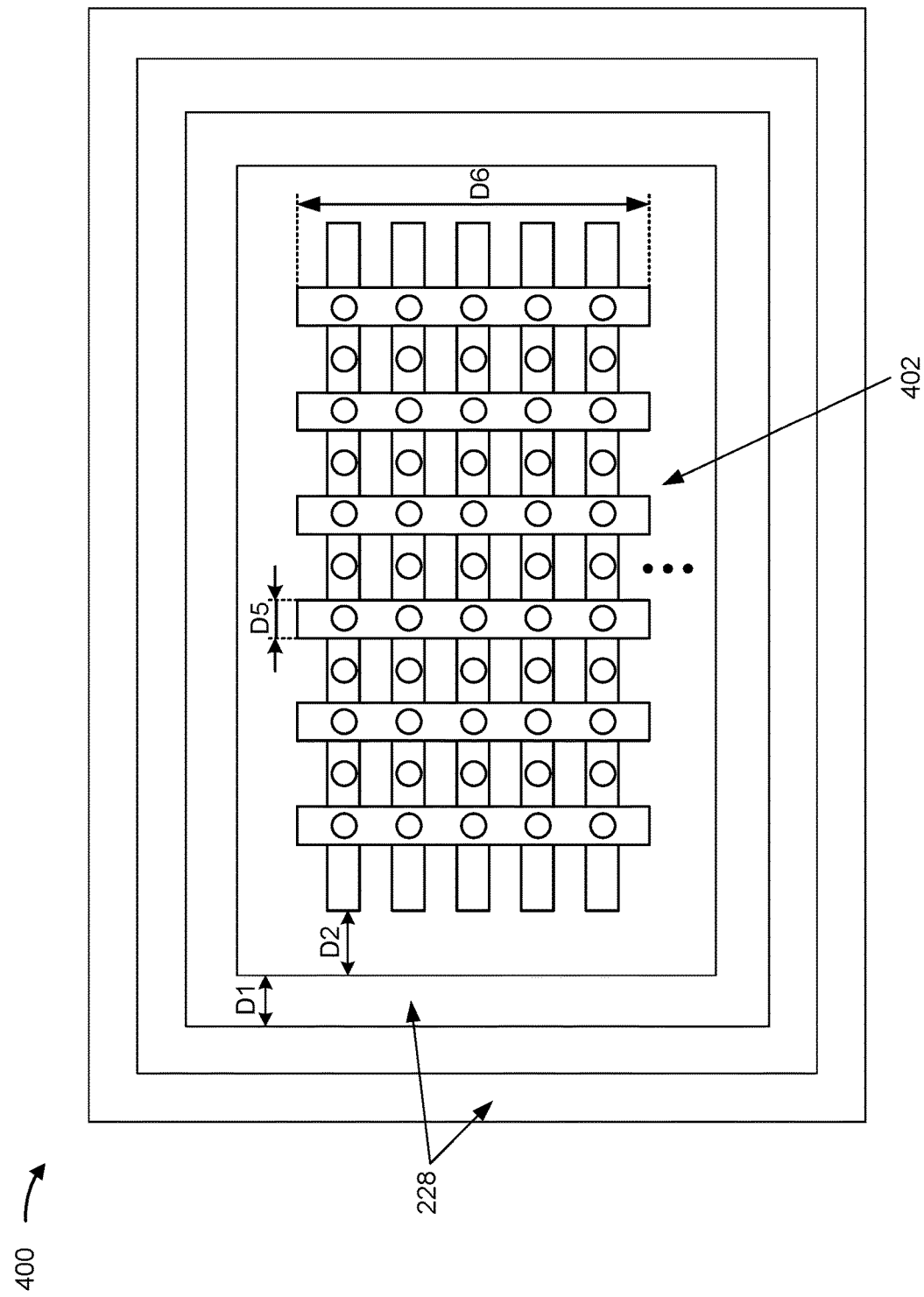

As shown in FIG. 4F, semiconductor device 400F may include two triple-stacked polysilicon structures 228 having widths D1, with an inner triple-stacked polysilicon structure 228 spaced from a polysilicon-based device 402 (e.g., the gate stack structure 226) with a distance D2. The two triple-stacked polysilicon structures 228 may surround the polysilicon-based device 402 in polygonal shapes and/or curved shapes, among other examples.

In some implementations, D1 may be greater than or equal to approximately 0.06 micrometers. In some implementations, D1 may be greater than or equal to a width D5 of polysilicon-based material in the polysilicon-based device 402 (e.g., in an X direction) and/or greater than or equal to a width D6 of the polysilicon-based material in the polysilicon-based device 402 (e.g., in an X direction). In some implementations, D1 may be greater than or equal to a lesser of a width D5 in the X direction or a width D6 in the Y direction. In some implementations, D2 may be greater than or equal to approximately 0.12 micrometers. A spacing between the two triple-stacked polysilicon structures 228 may be greater than or equal to approximately 0.12 micrometers.

As indicated above, FIGS. 4A-4F are provided as examples. Other examples may differ from what is described with regard to FIGS. 4A-4F. The number and arrangement of devices, layers, and/or materials shown in FIGS. 4A-4F are provided as an example. In practice, there may be additional devices, layers, and/or materials, fewer devices, layers, and/or materials, different devices, layers, and/or materials, or differently arranged devices, layers, and/or materials than those shown in FIGS. 4A-4F.

FIGS. 5A-5G are diagrams of example semiconductor structures described herein. FIGS. 5A-5G show the example triple-stacked polysilicon structures from a top view.

As shown in FIG. 5A, a triple-stacked polysilicon structure may include a solid rectangular shape, as viewed from a top view. As shown in FIG. 5B, a triple-stacked polysilicon structure may include a rectangular shape, with an opening in a middle of the rectangular shape (e.g., a rectangular perimeter shape), as viewed from a top view. As shown in FIG. 5C, a triple-stacked polysilicon structure may include multiple rectangular shapes in a grid pattern (e.g., an array), as viewed from a top view. As shown in FIG. 5D, a triple-stacked polysilicon structure may include multiple rectangular shapes, in a staggered pattern (e.g., a staggered array), as viewed from a top view. As shown in FIG. 5E, a triple-stacked polysilicon structure may include an irregular shape, as viewed from a top view. As shown in FIG. 5F, a triple-stacked polysilicon structure may include multiple rectangular shapes in a 4-corners pattern (e.g., with space for a polysilicon-based device between the 4 corners), as viewed from a top view. As shown in FIG. 5G, a triple-stacked polysilicon-based device may include multiple rectangular shapes in a staggered grid pattern with space for a polysilicon-based device at ends of the rectangular shapes and between sides of the rectangular shapes, as viewed from a top view.

As indicated above, FIGS. 5A-5G are provided as examples. Other examples may differ from what is described with regard to FIGS. 5A-5G. The number and arrangement of devices, layers, and/or materials shown in FIGS. 5A-5G are provided as an example. In practice, there may be additional devices, layers, and/or materials, fewer devices, layers, and/or materials, different devices, layers, and/or materials, or differently arranged devices, layers, and/or materials than those shown in FIGS. 5A-5G.

Figure 6:
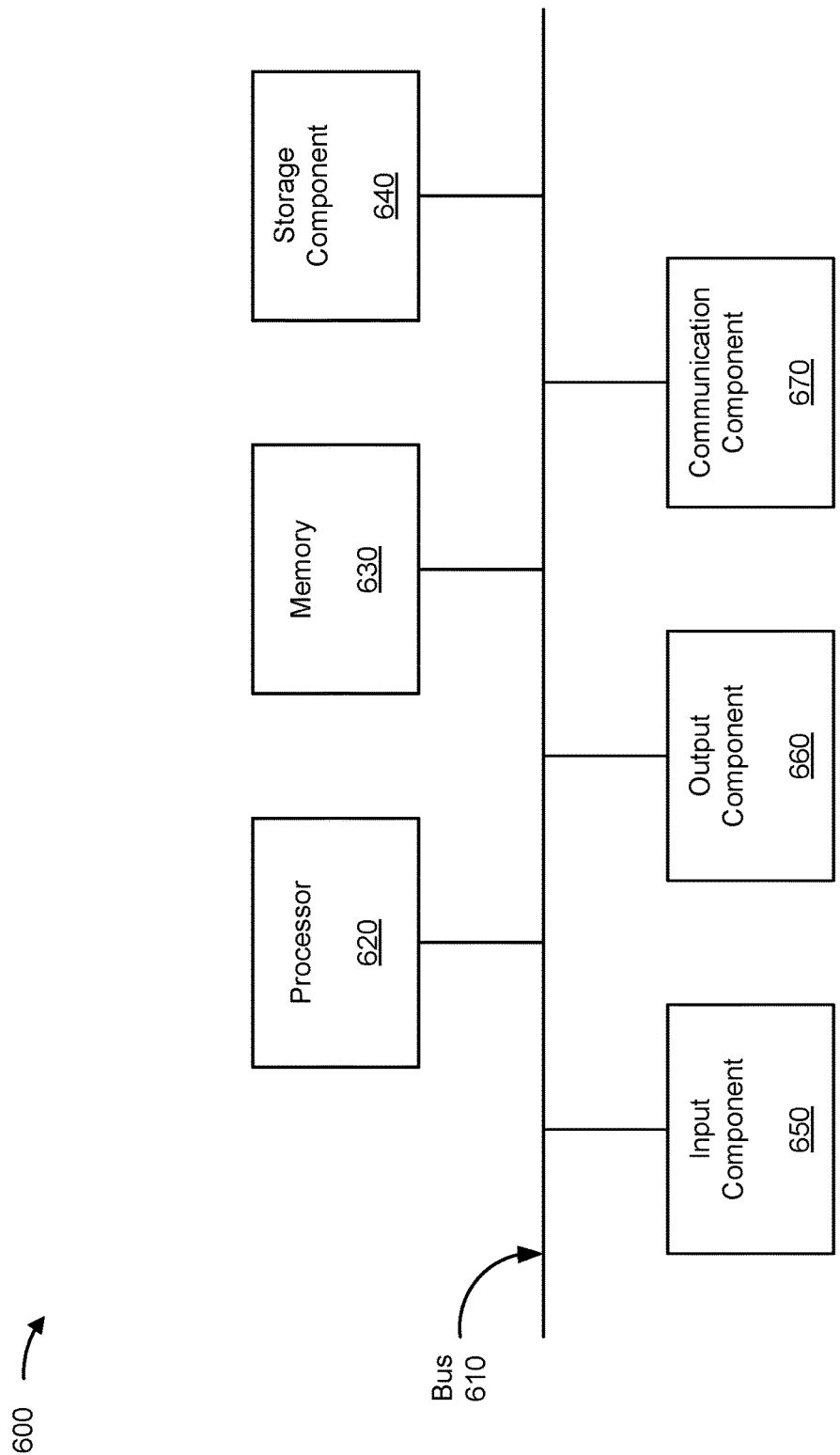
FIG. 6 is a diagram of example components of one or more devices of FIG. 1.

FIG. 6 is a diagram of example components of a device 600, which may correspond to deposition tool 102, etching tool 104, CMP tool 106, and/or wafer/die transport tool 108. In some implementations, deposition tool 102, etching tool 104, CMP tool 106, and/or wafer/die transport tool 108 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
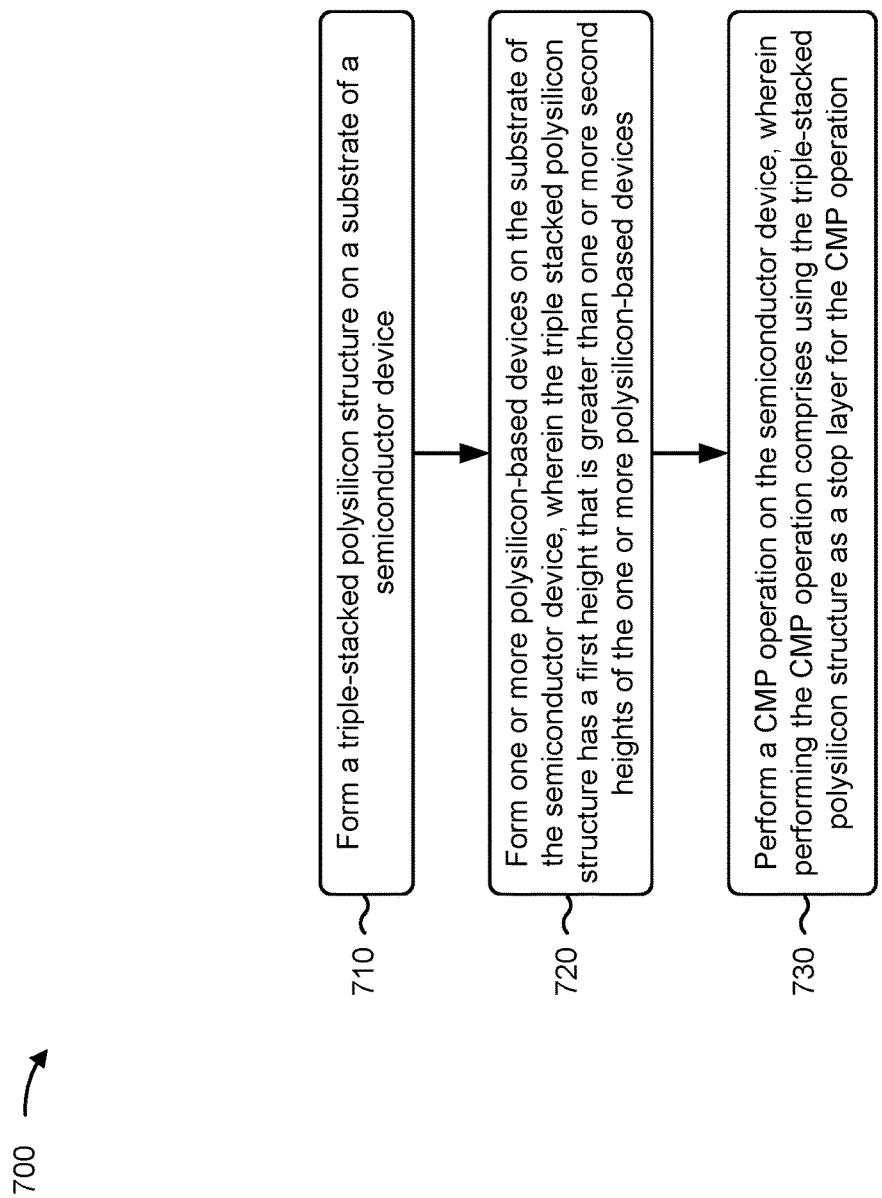
FIG. 7 is a flowchart of an example process relating to forming a semiconductor device, as described herein.

FIG. 7 is a flowchart of an example process 700 of manufacturing a semiconductor device. In some implementations, one or more process blocks of FIG. 7 may be performed by one or more semiconductor processing tools (e.g., one or more of deposition tool 102, etching tool 104, CMP tool 106, and/or wafer/die transport tool 108). Additionally, or alternatively, one or more process blocks of FIG. 6 may be performed by one or more components of device 600, such as processor 620, memory 630, storage component 640, input component 650, output component 660, and/or communication component 670.

As shown in FIG. 7, process 700 may include forming a triple-stacked polysilicon structure on a substrate of a semiconductor device (block 710). For example, the one or more semiconductor processing tools may form a triple-stacked polysilicon structure 228 on a substrate 202 of a semiconductor device 200, as described above.

As further shown in FIG. 7, process 700 may include forming one or more polysilicon-based devices on the substrate of the semiconductor device, wherein the triple-stacked polysilicon structure has a first height that is greater than one or more second heights of the one or more polysilicon-based devices (block 720). For example, the one or more semiconductor processing tools may form one or more polysilicon-based devices (e.g., logic polysilicon structure 216 and/or gate stack structure 226) on the substrate 202 of the semiconductor device 200, as described above. In some implementations, the triple-stacked polysilicon structure 228 has a first height that is greater than one or more second heights of the one or more polysilicon-based devices (e.g., logic polysilicon structure 216 and/or gate stack structure 226).

As further shown in FIG. 7, process 700 may include performing a chemical-mechanical polishing (CMP) operation on the semiconductor device, wherein performing the CMP operation comprises using the triple-stacked polysilicon structure as a stop layer for the CMP operation (block 730). For example, the one or more semiconductor processing tools may perform a chemical-mechanical polishing (CMP) operation on the semiconductor device 200, as described above. In some implementations, performing the CMP operation comprises using the triple-stacked polysilicon structure 228 as a stop layer for the CMP operation.

Process 700 may include additional implementations, such as any single implementation or any combination of implementations described below and/or in connection with one or more other processes described elsewhere herein.

In a first implementation, process 700 includes depositing, before performing the CMP operation, an inter-layer dielectric on the semiconductor device, wherein performing the CMP operation comprises removing a portion of the inter-layer dielectric and a portion of the triple-stacked polysilicon structure.

In a second implementation, alone or in combination with the first implementation, process 700 includes forming a contact on at least one of the one or more polysilicon-based devices and within the inter-layer dielectric, and forming an electrode on the contact and on the inter-layer dielectric.

In a third implementation, alone or in combination with one or more of the first and second implementations, forming the triple-stacked polysilicon structure comprises depositing a first polysilicon-based layer as part of the triple-stacked polysilicon structure, wherein the first polysilicon-based layer forms part of at least one of the one or more polysilicon-based devices.

In a fourth implementation, alone or in combination with one or more of the first through third implementations, forming the triple-stacked polysilicon structure comprises depositing a first polysilicon-based layer, a second polysilicon-based layer, and a third polysilicon-based layer as part of the triple-stacked polysilicon structure, wherein the first polysilicon-based layer forms part of at least one of the one or more polysilicon-based devices, wherein the second polysilicon-based layer forms part of at least one of the one or more polysilicon-based devices, and wherein the third polysilicon-based layer forms part of at least one of the one or more polysilicon-based devices.

In a fifth implementation, alone or in combination with one or more of the first through fourth implementations, at least one of the one or more polysilicon-based devices comprises a logic polysilicon structure, or a gate stack structure.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, the CMP operation may stop before exposing the one or more polysilicon-based devices. A portion of inter-layer dielectric above the one or more polysilicon-based devices may provide a layer of insulation between the one or more polysilicon-based devices and an electrode on the inter-layer dielectric. This may reduce or prevent shorting between the one or more polysilicon-based devices and the electrode, which may reduce defects from the manufacturing process.

As described in greater detail above, some implementations described herein provide a semiconductor device. The semiconductor device includes a triple-stacked polysilicon structure having a first height and disposed on a substrate of the semiconductor device. The triple-stacked polysilicon structure includes a floating gate layer, a control gate layer, and a logic polysilicon layer. The semiconductor device also includes one or more polysilicon-based devices having one or more second heights and disposed on the substrate of the semiconductor device, where the first height is greater than the one or more second heights. The semiconductor device includes an inter-layer dielectric between the triple-stacked polysilicon structure and the one or more polysilicon-based devices, with the inter-layer dielectric extending above the one or more polysilicon-based devices.

As described in greater detail above, some implementations described herein provide a semiconductor device. The semiconductor device includes a first triple-stacked polysilicon structure having a first height and disposed on a substrate of the semiconductor device. The triple-stacked polysilicon structure includes a floating gate layer, a control gate layer, and a logic polysilicon layer. The semiconductor device includes one or more polysilicon-based devices disposed on the substrate of the semiconductor device. The one or more polysilicon-based devices include one or more of a portion of the floating gate layer, a portion of the control gate layer, or a portion of the logic polysilicon layer. One or more second heights of the one or more polysilicon-based devices are less than the first height and the one or more polysilicon-based devices are positioned between the first triple-stacked polysilicon structure and a second triple-stacked polysilicon structure.

As described in greater detail above, some implementations described herein provide a method. The method includes forming a triple-stacked polysilicon structure on a substrate of a semiconductor device. The method includes forming one or more polysilicon-based devices on the substrate of the semiconductor device. The triple-stacked polysilicon structure has a first height that is greater than one or more second heights of the one or more polysilicon-based devices. The method includes performing a chemical-mechanical polishing (CMP) operation on the semiconductor device. Performing the CMP operation includes using the triple-stacked polysilicon structure as a stop layer for the CMP operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a triple-stacked polysilicon structure having a first height and disposed on a substrate of the semiconductor device, the triple-stacked polysilicon structure comprising:
      a first portion of a first polysilicon-based layer,
      a second polysilicon-based layer disposed above the first portion of the first polysilicon-based layer, and
      a third polysilicon-based layer disposed above the second polysilicon-based layer,
   one or more polysilicon-based devices having one or more second heights and disposed on the substrate of the semiconductor device,
      wherein the first height is greater than the one or more second heights, and
      wherein the one or more polysilicon-based devices comprises a second portion of the first polysilicon-based layer; and
   an inter-layer dielectric between the triple-stacked polysilicon structure and the one or more polysilicon-based devices,
      wherein the inter-layer dielectric extends above the one or more polysilicon-based devices.

2. The semiconductor device of claim 1, wherein at least one of the one or more polysilicon-based devices comprises a gate stack structure.

3. The semiconductor device of claim 1, wherein at least one of the one or more polysilicon-based devices comprises a logic polysilicon structure.

4. The semiconductor device of claim 1, wherein the triple-stacked polysilicon structure is disposed on an inactive area of the substrate of the semiconductor device.

5. The semiconductor device of claim 1, wherein the triple-stacked polysilicon structure is disposed on trench isolation material of the semiconductor device.

6. The semiconductor device of claim 1, wherein the triple-stacked polysilicon structure is disposed partially on trench isolation material of the semiconductor device and partially on an inactive area of the substrate of the semiconductor device.

7. The semiconductor device of claim 1, wherein the triple-stacked polysilicon structure is a first triple-stacked polysilicon structure,
   wherein the one or more polysilicon-based devices are positioned between the first triple-stacked polysilicon structure and a second triple-stacked polysilicon structure.

8. The semiconductor device of claim 7, wherein the first triple-stacked polysilicon structure is spaced from the second triple-stacked polysilicon structure with a distance that is less than approximately 150 micrometers.

9. The semiconductor device of claim 1, wherein the triple-stacked polysilicon structure comprises one or more of:
   a resistor of the semiconductor device, or
   a capacitor of the semiconductor device.

10. The semiconductor device of claim 1, wherein the triple-stacked polysilicon structure further comprises:
    a first oxide-based layer between the second polysilicon-based layer and the substrate of the semiconductor device,
    a dielectric layer between the second polysilicon-based layer and the third polysilicon-based layer,
    a second oxide-based layer between the third polysilicon-based layer and the first polysilicon-based layer, or
    a combination thereof.

11. A semiconductor device, comprising:
    a first triple-stacked polysilicon structure having a first height and disposed on a substrate of the semiconductor device, the first triple-stacked polysilicon structure comprising:
       a first portion of a first polysilicon-based layer,
       a second polysilicon-based layer disposed above the first portion of the first polysilicon-based layer, and
       a third polysilicon-based layer disposed above the second polysilicon-based layer; and
    one or more polysilicon-based devices disposed on the substrate of the semiconductor device, a first polysilicon-based device of the one or more polysilicon-based devices comprising one or more of:
       a second portion of the first polysilicon-based layer,
       wherein one or more second heights of the one or more polysilicon-based devices are less than the first height, and
       wherein the one or more polysilicon-based devices are positioned between the first triple-stacked polysilicon structure and a second triple-stacked polysilicon structure.

12. The semiconductor device of claim 11, wherein a second polysilicon-based device of the one or more polysilicon-based devices comprises:
    a second polysilicon-based layer and a portion of the third polysilicon-based layer.

13. The semiconductor device of claim 11, further comprising:
    an inter-layer dielectric on the semiconductor device,
       wherein the inter-layer dielectric is disposed between the first triple-stacked polysilicon structure and the one or more polysilicon-based devices, and
       wherein the inter-layer dielectric is disposed on the one or more polysilicon-based devices.

14. The semiconductor device of claim 13, further comprising:
    an electrode disposed on the inter-layer dielectric; and
    a contact disposed within the inter-layer dielectric,
       wherein the contact connects the electrode to at least one of the one or more polysilicon-based devices.

15. A method, comprising:
forming a triple-stacked polysilicon structure and one or more polysilicon-based devices on a substrate of a semiconductor device,
  wherein the triple-stacked polysilicon structure has a first height that is greater than one or more second heights of the one or more polysilicon-based devices, and
  wherein forming the triple-stacked polysilicon structure and the one or more polysilicon-based devices comprises:
    depositing a first portion of a first polysilicon-based layer above a first portion of the substrate associated with the triple-stacked polysilicon structure and a second portion of the first polysilicon-based layer above one or more second portions of the substrate associated with the one or more polysilicon-based devices,
    depositing a second polysilicon-based layer above the first portion of the first polysilicon-based layer, and
    depositing a third polysilicon-based layer above the second polysilicon-based layer; and
performing a chemical-mechanical polishing (CMP) operation on the semiconductor device,
  wherein performing the CMP operation comprises using the triple-stacked polysilicon structure as a stop layer for the CMP operation.

16. The method of claim 15, further comprising:
depositing, before performing the CMP operation, an inter-layer dielectric on the semiconductor device,
  wherein performing the CMP operation comprises removing a portion of the inter-layer dielectric and a portion of the triple-stacked polysilicon structure.

17. The method of claim 16, further comprising:
forming a contact on at least one of the one or more polysilicon-based devices and within the inter-layer dielectric; and
forming an electrode on the contact and on the inter-layer dielectric.

18. The method of claim 15, wherein forming the triple-stacked polysilicon structure is a first triple-stacked polysilicon structure; and
wherein the method further comprises:
  depositing the first polysilicon-based layer as part of a second triple-stacked polysilicon structure,
    wherein the first polysilicon-based layer forms part of at least one of the one or more polysilicon-based devices.

19. The method of claim 15,
wherein the first polysilicon-based layer forms part of a first polysilicon-based device of the one or more polysilicon-based devices,
wherein the second polysilicon-based layer forms part of a second polysilicon-based device of the one or more polysilicon-based devices, and
wherein the third polysilicon-based layer forms part of the second polysilicon-based device.

20. The method of claim 15, wherein at least one of the one or more polysilicon-based devices comprises:
  a logic polysilicon structure, or
  a gate stack structure.

* * * * *

UNITED STATES PATENT AND TRADEMARK OFFICE
CERTIFICATE OF CORRECTION

PATENT NO. : 11,563,127 B2
APPLICATION NO. : 17/143820
DATED : January 24, 2023
INVENTOR(S) : Chi-Chung Jen et al.

It is certified that error appears in the above-identified patent and that said Letters Patent is hereby corrected as shown below:

In the Claims

In Claim 11, Column 18, Line 40, "comprising one or more of:" should be changed to
-- comprising: --;

In Claim 12, Column 18, Line 52, "a second polysilicon-based layer" should be changed to -- a portion of the second polysilicon-based layer --;

In Claim 18, Column 20, Line 10, "wherein forming the triple-" should be changed to -- wherein the triple- --.

Signed and Sealed this
Fourteenth Day of March, 2023

Katherine Kelly Vidal
*Director of the United States Patent and Trademark Office*